(12) United States Patent
Nogami et al.

(10) Patent No.: US 6,693,036 B1
(45) Date of Patent: Feb. 17, 2004

(54) METHOD FOR PRODUCING SEMICONDUCTOR DEVICE POLISHING APPARATUS, AND POLISHING METHOD

(75) Inventors: Takeshi Nogami, Kanagawa (JP); Akira Yoshio, Tokyo (JP); Shuzo Sato, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/655,833

(22) Filed: Sep. 6, 2000

(30) Foreign Application Priority Data

Sep. 7, 1999 (JP) .......................... 11-253605

(51) Int. Cl.[7] ..................... H01L 21/302; H01L 21/461
(52) U.S. Cl. ....................... 438/692; 438/693
(58) Field of Search ................ 438/692, 693; 252/79.2; 216/56

(56) References Cited

U.S. PATENT DOCUMENTS

| | | | | |
|---|---|---|---|---|
| 5,575,706 A | * | 11/1996 | Tsai et al. | 451/41 |
| 5,637,031 A | * | 6/1997 | Chen | 451/41 |
| 5,911,619 A | * | 6/1999 | Uzoh et al. | 451/5 |
| 5,985,093 A | * | 11/1999 | Chen | 156/345 |
| 6,069,083 A | * | 5/2000 | Miyashita et al. | 438/693 |
| 6,096,652 A | * | 8/2000 | Watts et al. | 438/692 |
| 6,121,149 A | * | 9/2000 | Lukanc et al. | 438/692 |
| 6,159,858 A | * | 12/2000 | Kishii et al. | 438/693 |
| 6,171,467 B1 | * | 1/2001 | Wiehs et al. | 205/93 |
| 6,251,787 B1 | * | 6/2001 | Edelstein et al. | 438/692 |
| 6,297,159 B1 | * | 10/2001 | Paton | 438/693 |
| 6,362,106 B1 | * | 3/2002 | Kaufman et al. | 438/692 |
| 6,376,345 B1 | * | 4/2002 | Ohashi et al. | 438/542 |

FOREIGN PATENT DOCUMENTS

JP  2000-208443 A  *  7/2000

* cited by examiner

Primary Examiner—George Fourson
Assistant Examiner—Fernando L Toledo
(74) Attorney, Agent, or Firm—Rader, Fishman & Grauer PLLC; Ronald P. Kananen

(57) ABSTRACT

A method for producing a semiconductor device, polishing method, and polishing apparatus, suppressing occurrence of dishing and erosion in a flattening process by polishing of a metal film for constituting an interconnection of a semiconductor device having a multilayer interconnection structure. The production method includes the steps of: forming a passivation film exhibiting an action of inhibiting an electrolytic reaction of a metal at the surface of the metal film; selectively removing the passivation film on a projecting portion so as to expose the projecting portion of the metal film at the surface; removing the exposed projecting portion of the metal film by electrolytic polishing so as to flatten unevenness of the surface of the metal film; and removing the metal film present on an insulation film from the metal film with the flattened surface by electrolytic composite polishing combining electrolytic polishing and mechanical polishing so as to form an interconnection.

18 Claims, 25 Drawing Sheets

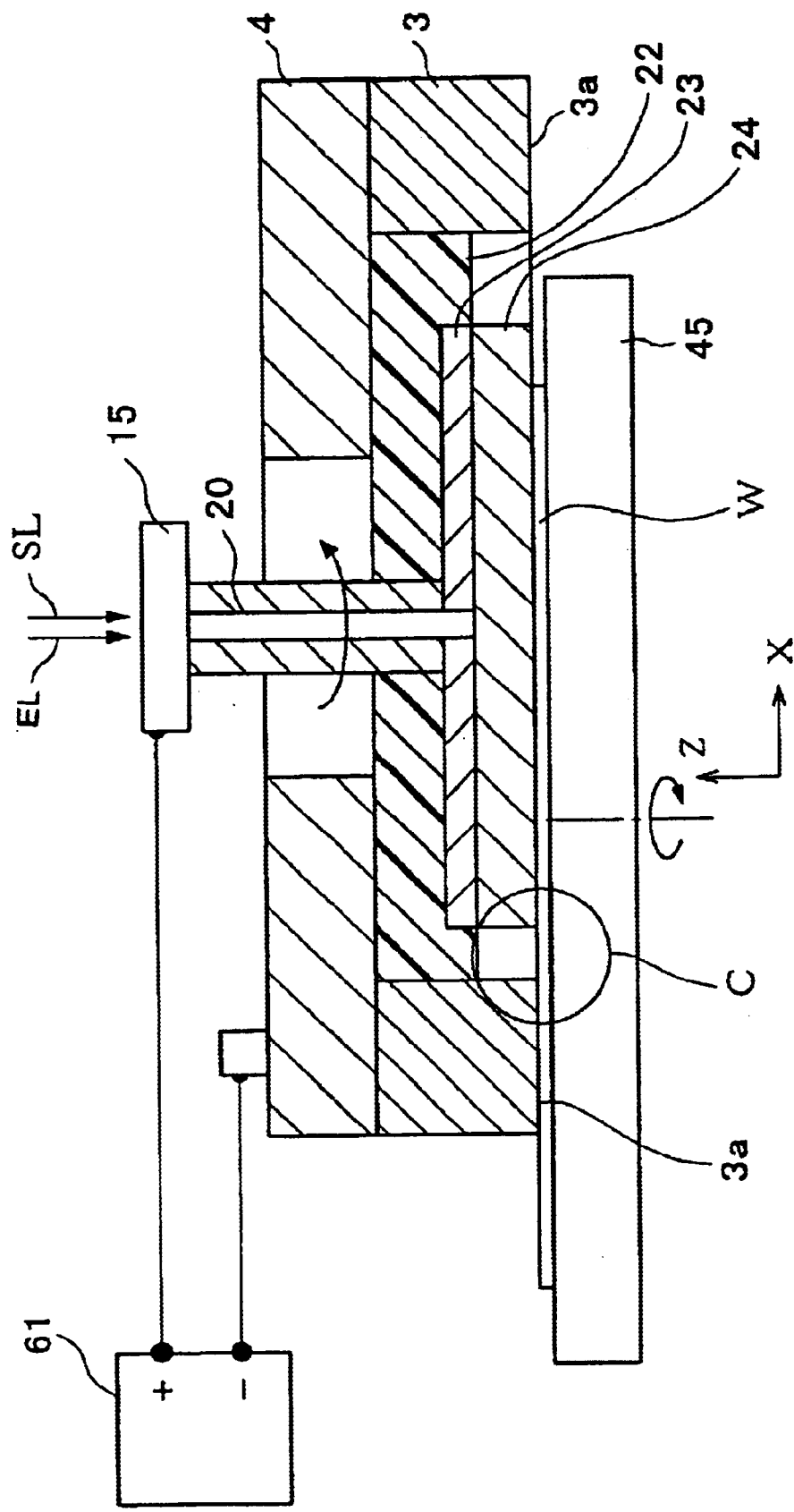

METHOD FOR PRODUCING SEMICONDUCTOR DEVICE POLISHING APPARATUS, AND POLISHING METHOD

BACKGROUND OF THE INVENTION

1. Field of the Invention

The present invention relates to a polishing apparatus and a polishing method for flattening an uneven surface accompanying for example a multilayer interconnection structure of a semiconductor device and a method for producing a semiconductor device having a multilayer interconnection structure.

2. Description of the Related Art

Along with the increase in integration and reduction of size of semiconductor devices, progress has been made in miniaturization of interconnections, reduction of interconnection pitch, and superposition of interconnections. The importance of the multilayer interconnection technology in the manufacturing process of semiconductor devices is therefore rising.

On the other hand, conventionally aluminum (Al) has been frequently used as an interconnection material of a semiconductor device having a multilayer interconnection structure, but in order to suppress the propagation delay of signals in the recent 0.25 $\mu$m design rule, there is active development of an interconnection process replacing the aluminum (Al) of the interconnection material by copper (Cu). When using Cu for interconnections, there is the merit that both a low resistance and a high electromigration tolerance can be obtained.

In a process using this Cu for interconnections, for example, an interconnection process referred to as the damascene process for burying a metal in a groove-like interconnection pattern formed in an interlayer insulation film in advance, removing excess metal film by a chemical mechanical polishing (CMP) process, and thereby forming the interconnections has become influential. The damascene process has the characteristics that etching of the interconnections becomes unnecessary and also a further upper interlayer insulation film becomes flat by itself, so the manufacturing steps can be simplified.

Further, in the dual damascene process, where not only the interconnections, but also the contact holes are formed as grooves in the interlayer insulation film and the interconnections and the contact holes are simultaneously buried by the metal, further great reduction of the interconnection process becomes possible.

Here, an explanation will be made of an example of the process for forming interconnections by the dual damascene process by referring to FIG. 32 to FIG. 37. Note that the explanation will be made of the case where Cu is used as the interconnection material.

First, as shown in FIG. 32, for example, an interlayer insulation film 302 made of for example a silicon oxide film is formed for example, by a low pressure chemical vapor deposition (CVD) process on a substrate 301 made of silicon or another semiconductor on which a not illustrated impurity diffusion layer is appropriately formed.

Next, as shown in FIG. 33, contact holes 303 communicating with the impurity diffusion region of the substrate 301 and grooves 304 in which a predetermined pattern of interconnections to be electrically connected to the impurity diffusion region of the substrate 301 is to be formed are formed by using a well known photolithography technique and etching technique.

Next, as shown in FIG. 34, a barrier film 305 is formed on the surface of the interlayer insulation film 302 and in the contact holes 303 and the grooves 304. This barrier film 305 is formed by a material such as for example Ta, Ti, TaN, or TiN by the well known sputtering process. The barrier film 305 is provided so as to prevent diffusion of the material comprising the interconnections into the inter-layer insulation film 302. Particularly, in a case where the interconnection material is Cu and the inter-layer insulation film 302 is a silicon oxide film, Cu has a large diffusion coefficient with respect to the silicon oxide film and is easily oxidized, so this is prevented.

Next, as shown in FIG. 35, a seed Cu film 306 is formed on the barrier film 305 to a predetermined thickness by a well known sputtering process, then, as shown in FIG. 36, a Cu film 307 is formed so as to bury the contact holes 303 and the grooves 304 by Cu. The Cu film 307 is formed by for example a plating process, CVD process, sputtering process, etc.

Next, as shown in FIG. 37, an excess Cu film 307 and barrier film 305 on the inter-layer insulation film 302 are removed by the CMP process and flattened.

Due to this, interconnections 308 and contacts 309 are formed.

By repeating the above process on the interconnections 308, the multilayer interconnections can be formed.

Summarizing the problems to be solved by the invention, in the step of removing the excess Cu film 307 and barrier film 305 by the CMP process in the multilayer interconnection forming process using the dual damascene process, the removal performance differs between the inter-layer insulation film 302 and the Cu film 307 and barrier film 305, therefore there has been the disadvantage that dishing, erosion (thinning), recesses, etc. easily occur in the interconnections 308.

Dishing is a phenomenon where, as shown in FIG. 38, when there is an interconnection 308 having a wide width of for example about 100 $\mu$m at a design rule of for example the 0.18 $\mu$m rule, the center portion of the interconnection is excessively removed and sinks: If this dishing occurs, the sectional area of the interconnection 308 becomes insufficient. This becomes a cause of poor interconnection resistance etc. This dishing is apt to occur when copper or aluminum, which is relatively soft, is used as the interconnection material.

Erosion is a phenomenon where, as shown in FIG. 39, a portion having a high pattern density where interconnections with a width of 1.0 $\mu$m are formed at a density of 50% in a range of for example 3000 $\mu$m are excessively removed. When erosion occurs, the sectional area of the interconnections becomes insufficient. This becomes a cause of poor interconnection resistance etc.

Recess, or "recessing" is a phenomenon where, as shown in FIG. 40, the interconnection 308 becomes low at the interface between the inter-layer insulation film 302 and the interconnection 308. In this case as well, the sectional area of the interconnections becomes insufficient. This becomes a cause of poor interconnection resistance etc.

Further, in the step of removing the excess Cu film 307 and barrier film 305 by the CMP process, it is necessary to efficiently remove the Cu film 307 and barrier film 305. The amount of removal per unit time, that is, the polishing rate, is required to become for example more than 500 nm/min. In order to obtain this polishing rate, it is necessary to increase the polishing pressure with respect to the wafer. When the polishing pressure is raised, as shown in FIG. 41, a scratch SC and chemical damage CD are apt to occur in the interconnection surface. In particular, they easily occur in the soft Cu or aluminum. For this reason, it becomes a cause of opening of the interconnections, short-circuiting, poor interconnection resistance, and other disadvantages. Further, if the polishing pressure is raised, there is the inconvenience that the amount of the occurrence of dishing, erosion, and recesses becomes larger.

SUMMARY OF THE INVENTION

An object of the present invention is to provide a polishing apparatus and a polishing method and a method for producing a semiconductor device capable of easily flattening an initial unevenness when flattening a metal film such as an interconnection of a semiconductor device having a multilayer interconnection structure by polishing and excellent in efficiency of removal of the excess metal film and capable of suppressing occurrence of excessive removal of the metal film such as dishing and erosion.

To attain the above object, a polishing apparatus of the present invention is provided with a polishing tool having a polishing surface and having conductivity, a polishing tool rotating and holding means for rotating the polishing tool about a predetermined axis of rotation and holding the same, a rotating and holding means for holding a polishing object and rotating the same about a predetermined axis of rotation, a movement and positioning means for moving and positioning the polishing tool to a target position in a direction facing the polishing object, a relative moving means for making the polished surface of the polishing object and the polishing surface of the polishing tool relatively move along a predetermined plane, an electrolyte feeding means for feeding an electrolyte onto the polished surface of the polishing object, and an electrolytic current supplying means for supplying an electrolytic current flowing through the polishing tool through the electrolyte from the polished surface by using the polished surface of the polishing object as an anode and the polishing tool as a cathode.

Further, the polishing apparatus of the present invention is a polishing apparatus which is provided with a polishing tool having a polishing surface which contacts the entire surface of the polished surface of the polishing object while rotating and which brings the polishing object into contact with the polished surface while rotating it so as to flatten and polish the same, wherein the apparatus further has an electrolyte feeding means for feeding an electrolyte onto the polishing surface, is provided with an anode electrode and a cathode electrode capable of supplying electric power to the polished surface of the polishing object in the polishing surface, and flattens and polishes the polished surface of the polishing object by electrolytic composite polishing which combines electrolytic polishing by the electrolyte and mechanical polishing by the polishing surface.

The polishing method of the present invention comprises pushing the polishing surface of a conductive polishing tool and the surface of the polishing object with a metal film formed on at least the surface or an inner layer against each other while interposing the electrolyte therebetween, supplying the electrolytic current flowing from the surface of the polishing object to the polishing tool through the electrolyte by using the polishing tool as a cathode and the surface of the polishing object as an anode, making the polishing tool and the polishing object move relatively along a predetermined plane while rotating the two, and flattening the metal film formed on the polishing object by electrolytic composite polishing combining electrolytic polishing by the electrolyte and mechanical polishing by the polishing surface.

Further, a polishing method of the present invention comprises a step of forming a passivation film exhibiting a function of preventing an electrolytic reaction of the metal film at the surface of the metal film formed on the polishing object; a step of pushing the polishing surface of a conductive polishing tool and a metal film against each together while interposing an electrolyte between the polishing surface and the metal film, and then applying a predetermined voltage between the polishing tool and the metal film; a step of making the polishing surface of the polishing tool and the metal film of the polishing object move relatively along a predetermined plane and selectively removing a passivation film on a projecting portion projected from the polishing surface of the polishing tool in the metal film by mechanical polishing by the polishing tool; and a step of removing a projecting portion of the metal film exposed at the surface due to the removal of the passivation film by the electrolytic polishing function by the electrolyte and flattening the metal film.

A method for producing a semiconductor device of the present invention comprises a step of forming an interconnection use groove for forming an interconnection in an insulation film formed on a substrate, a step of stacking a metal film on the insulation film so as to bury the interconnection use groove, a step of forming a passivation film exhibiting a function of preventing the electrolytic reaction of the metal film at the surface of the metal film stacked on the insulation film, a step of selectively removing the passivation film on a projecting portion existing at the surface of the metal film generated by the burying of the interconnection use groove in the passivation film formed on the metal film by mechanical polishing and thereby exposing the projecting portion of the related metal at the surface, and a step of removing the projecting portion of the exposed metal film by electrolytic polishing and flattening the unevenness of the surface of the metal film generated due to the burying of the interconnection use groove.

Further, the method for producing the semiconductor device of the present invention further comprises a step of removing the excess metal film existing on the insulation film of the metal film with the surface flattened by electrolytic composite polishing combining electrolytic polishing and mechanical polishing to thereby form the interconnection.

In the method of production of the semiconductor device of the present invention, by forming a passivation film on a metal film having unevenness at its surface and mechanically removing the passivation film, a projecting portion of the metal film is exposed at the surface. The projecting portion of this metal film is selectively eluted by the electrolytic action of the electrolyte using the remaining passivation film as a mask. As a result, the initial unevenness of the metal film is flattened.

Further, the metal film with the initial unevenness flattened is highly efficiently removed by the electrolytic composite polishing. For example, the excess metal film existing on the insulation film is highly efficiently removed when forming the interconnection.

When the excess metal film is removed and the insulation film is exposed, the electrolytic action at that portion automatically stops, so the metal film buried in the interconnection use groove formed in the insulation film is not excessively removed.

BRIEF DESCRIPTION OF THE DRAWINGS

The above object and features of the present invention will be more apparent from the following description of the preferred embodiments with reference to the accompanying drawings, wherein:

FIG. 5, having FIGS. 5 and 5B, is a view of the situation of making the wafer move in an X-axial direction with respect to a polishing tool;

FIG. 6 is a schematic view of the state of polishing a wafer by a polishing head;

DESCRIPTION OF THE PREFERRED EMBODIMENTS

Figure 1:
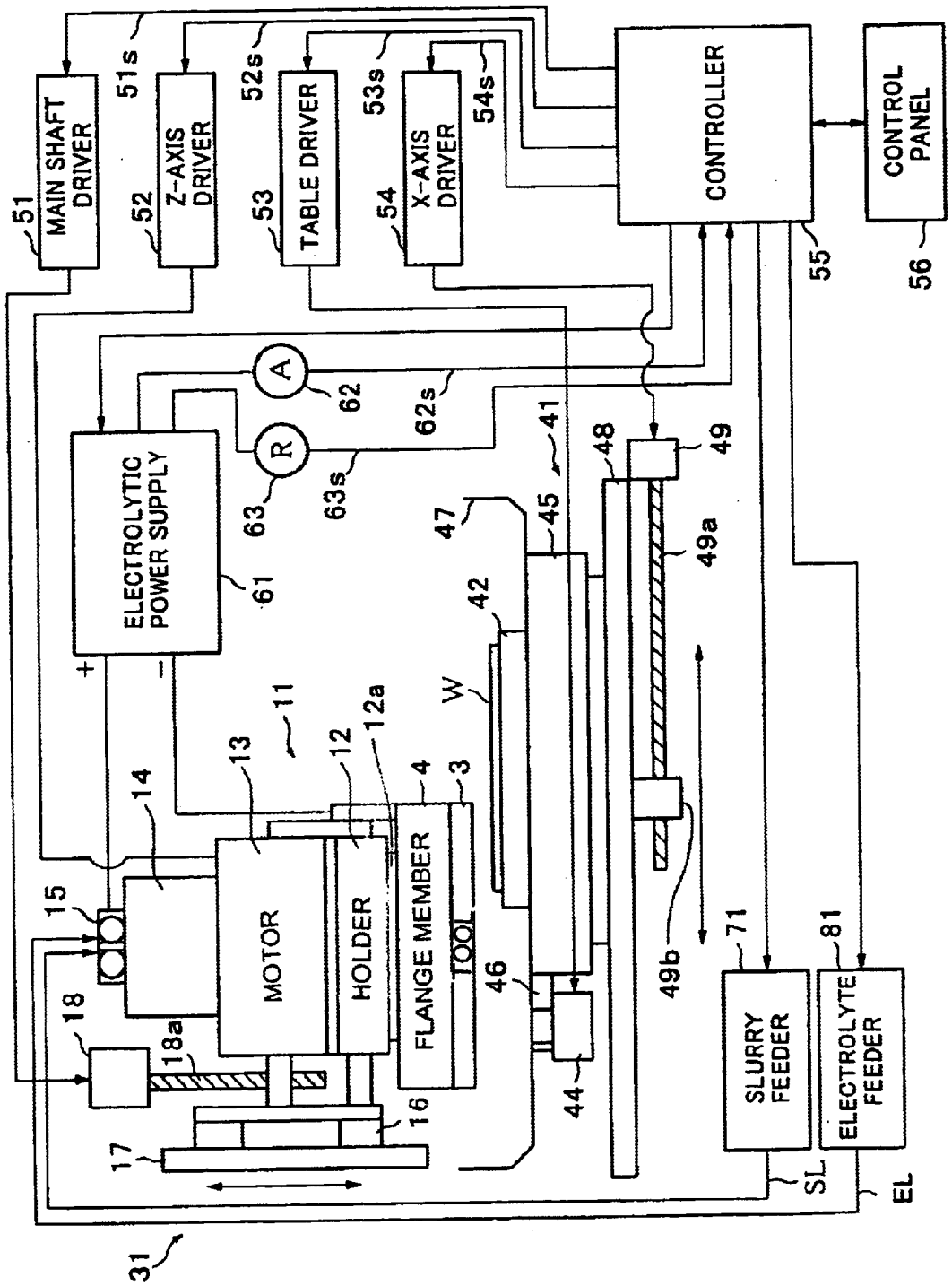
FIG. 1 is a view of the configuration of a polishing apparatus according to an embodiment of the present invention.

Below, an explanation will be made of preferred embodiments of the present invention by referring to the drawings.

Configuration of Polishing Apparatus

Figure 2:
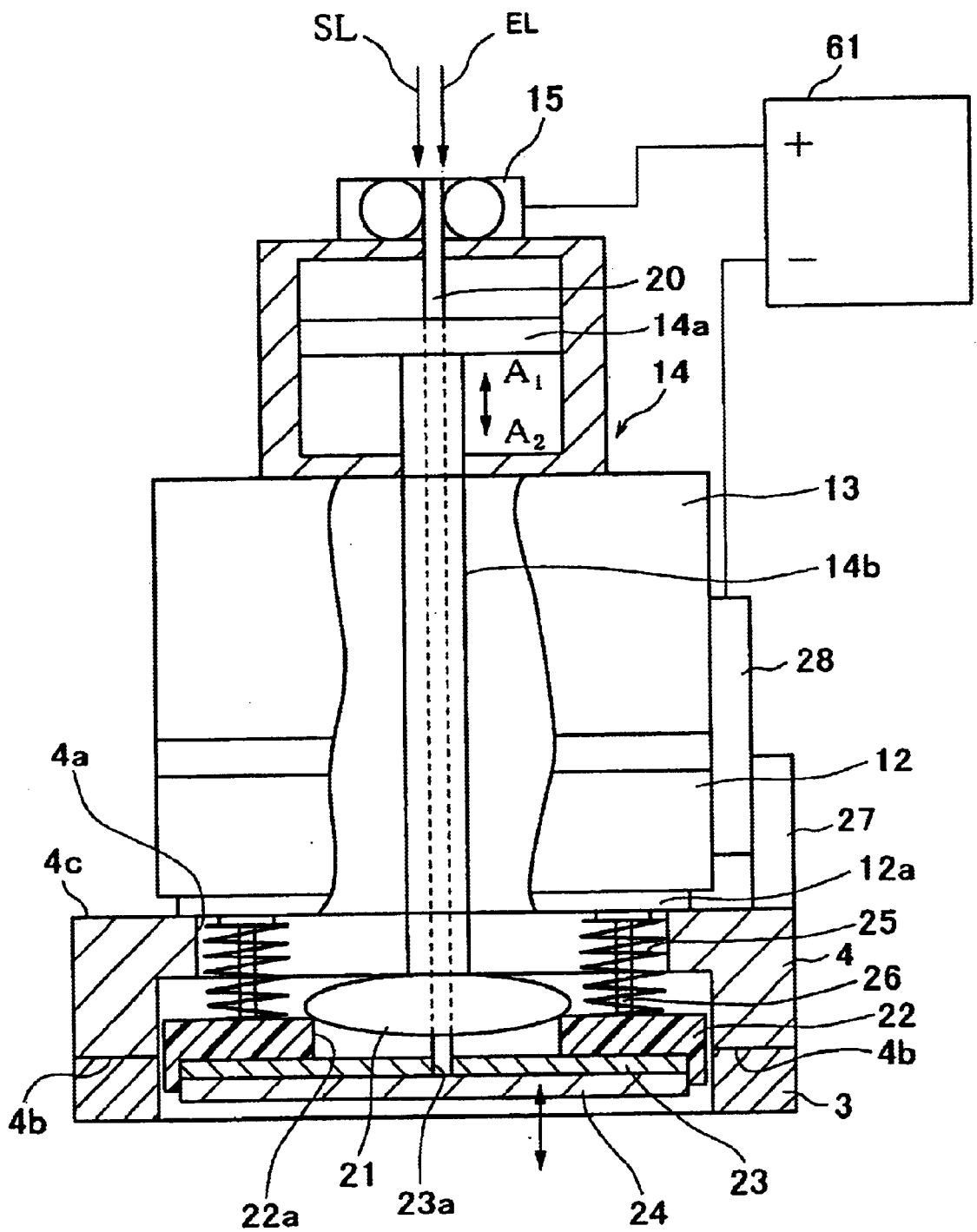
FIG. 2 is an enlarged view of details of a polishing head of the polishing apparatus of FIG. 1.

FIG. 1 is a view of a configuration of a polishing apparatus according to an embodiment of the present invention. FIG. 2 is an enlarged view of a principal portion of a polishing head of the polishing apparatus shown in FIG. 1.

A polishing apparatus 1 shown in FIG. 1 is provided with a polishing head 2, an electrolytic power supply 61, a controller 55 having a function of controlling the entire polishing apparatus 1, a slurry feeder 71, and an electrolyte feeder 81. Note that, although not illustrated, the polishing apparatus 1 is installed in a clean room, and a loading/unloading port for loading and unloading a wafer cassette storing wafers as the polishing objects in or out of the clean room is provided in the clean room. Further, a wafer conveyance robot for transferring the wafer between the wafer cassette loaded in the clean room through this loading/unloading port and the polishing apparatus 1 is arranged between the loading/unloading port and the polishing apparatus 1.

The polishing head 2 is provided with a polishing tool holder 11 for holding and rotating the polishing tool 3 and holding the polishing tool 3, a Z-axis positioning mechanism 31 for positioning the polishing tool holder 11 to the target position in the Z-axial direction, and an X-axis movement mechanism 41 for holding and rotating a wafer W as the polishing object and moving it in the X-axial direction.

Note that the polishing tool holder 11 corresponds to a concrete example of the polishing tool rotating and holding means of the present invention, the X-axis movement mechanism 41 corresponds to a concrete example of the rotating and holding means and the relative moving means of the present invention, and the Z-axis positioning mechanism 31 corresponds to a concrete example of the movement and positioning means of the present invention.

The Z-axis positioning mechanism 31 has a Z-axis servo motor 18 fixed to a not illustrated column, a Z-axis slider 16 which is connected to a holder 12 and a main shaft motor 13 and formed with a screw portion screwed into a ball screw shaft 18a connected to the Z-axis servo motor 18, and a guide rail 17 arranged in a not illustrated column for holding the Z-axis slider 16 so that it can freely move in the Z-axial direction.

The Z-axis servo motor 18 is supplied with a drive current from a Z-axis driver 52 connected to the Z-axis servo motor 18 and driven to rotate. The ball screw shaft 18a is provided along the Z-axial direction. One end is connected to the Z-axis servo motor 18, while the other end rotatably held by the holding member provided in the not illustrated column.

Due to this, the Z-axis positioning mechanism 31 moves and positions the polishing tool 3 held at the polishing tool holder 11 to any position in the Z-axial direction by the drive of the Z-axis servo motor 18. The positioning precision of the Z-axis positioning mechanism 31 is set at for example about a resolution of about 0.1 µm.

The X-axis movement mechanism 41 has a wafer table 42 for chucking the wafer W, a holder 45 for rotatably holding the wafer table 42, a drive motor 44 for supplying a drive force for rotating the wafer table 42, a belt 46 for connecting the drive motor 44 and the rotation shaft of the holder 45, a polishing pan 47 provided in the holder 45, an X-axis slider 48 at which the drive motor 44 and the holder 45 are disposed, an X-axis servo motor 49 mounted on a not illustrated base, a ball screw shaft 49a connected to the X-axis servo motor 49, and a moveable member 49b connected to the X-axis slider 48 and with a screw portion screwed into the ball screw shaft 49a formed therein.

The wafer table 42 holds the wafer W by for example a vacuum suction means.

The polishing pan 47 is provided for collecting the used electrolyte and a slurry or other liquid.

The drive motor 44 is driven by supply of the drive current from a table driver 53. By controlling this drive current, the wafer table 42 can be rotated at a predetermined rotation speed.

The X-axis servo motor 49 is driven to rotate by the drive current supplied from an X-axis driver 54 connected to the X-axis servo motor 49. The X-axis slider 48 moves in the X-axial direction via the ball screw shaft 49a and the moveable member 49b. At this time, by controlling the drive current supplied to the X-axis servo motor 49, the control of the speed of the wafer table 42 in the X-axial direction becomes possible.

FIG. 2 is a view of an example of an internal structure of the polishing tool holder 11.

The polishing tool holder 11 is provided with the polishing tool 3, a flange member 4 for holding the polishing tool 3, the holder 12 for rotatably holding the flange member 4, a main shaft motor 13 connected to a main shaft 12a held at the holder 12 and rotating the related main shaft 12a, and a cylinder device 14 provided on the main shaft motor 13.

The main shaft motor 13 is made of for example a direct drive motor. A not illustrated rotor of this direct drive motor is connected to the main shaft 12a held at the holder 12.

Further, the main shaft motor 13 has a through hole at its center into which a piston rod 14b of the cylinder device 14 is inserted. The main shaft motor 13 is driven by the drive current supplied from a main shaft driver 51.

The holder 12 is provided with for example an air bearing, and the main shaft 12a is rotatably held by this air bearing. Also, the main shaft 12a of the holder 12 has a through hole at its center into which the piston rod 14b of the cylinder device 14 is inserted.

The flange member 4 is formed by a metal material, connected to the main shaft 12a of the holder 12, provided with an opening 4a at its bottom, has a lower end face 4b to which the polishing tool 3 is tightly fixed.

An upper end face 4c side of the flange member 4 is connected to the main shaft 12a held at the holder 12. The flange member 4 rotates by the rotation of the main shaft 12a.

The upper end face 4c of the flange member 4 contacts a conductive brush 27 fixed to a conductive member 28 provided at the main shaft motor 13 and the side surface of the holder 12. The conductive brush 27 and the flange member 4 are electrically connected.

The cylinder device 14 is fixed on the case of the main shaft motor 13 and houses a piston 14a. The piston 14a is driven in either direction of arrows A1 and A2 by for example an air pressure fed into the cylinder device 14.

To this piston 14a is connected the piston rod 14b. The piston rod 14b passes through the center of the main shaft motor 13 and the holder 12 and projects from the opening 4a of the flange member 4.

The front end of the piston rod 14b has a pressing member 21 connected to this. This pressing member 21 is connected to the piston rod 14b by a connecting mechanism which can change in posture within a predetermined range.

The pressing member 21 can abut against a circumferential edge of an opening 22a of an insulation plate 22 arranged at a facing position and presses against the insulation plate 22 by the drive of the piston rod 14b to the direction indicated by the arrow A2.

At the center portion of the piston rod 14b of the cylinder device 14 is formed a through hole. A conductive shaft 20 is inserted into the through hole and fixed with respect to the piston rod 14b.

The conductive shaft 20 is formed by a conductive material. An upper end side passes through the piston 14a of the cylinder device 14 and extends to a rotary joint 15 provided on the cylinder device 14, while a lower end side passes through the piston rod 14b and the pressing member 21 and extends to the electrode plate 23 and is connected to the electrode plate 23.

The conductive shaft 20 is formed at its center with a through hole. This through hole forms a feed nozzle for feeding a chemical polishing agent (slurry) and the electrolyte onto the wafer W.

Further, the conductive shaft 20 performs the role of electrically connecting the rotary joint 15 and the electrode plate 23.

The rotary joint 15 connected to the upper end of the conductive shaft 20 is electrically connected to a plus pole of the electrolytic electrode 61. This rotary joint 15 maintains the power supply to the conductive shaft 20 even when the conductive shaft 20 rotates. Namely, even when the conductive shaft 20 rotates, a plus potential is applied from the electrolytic electrode 61 by the rotary joint 15.

The electrode plate 23 connected to the lower end of the conductive shaft 20 is made of a metal material and particularly formed by more precious metal than the metal film formed on the wafer W.

The electrode plate 23 is held at its upper surface side at the insulation plate 22, an outer circumference of the electrode plate 23 is fitted to the insulation plate 22, and the scrub member 24 is adhered to the lower surface side.

Figure 3A:
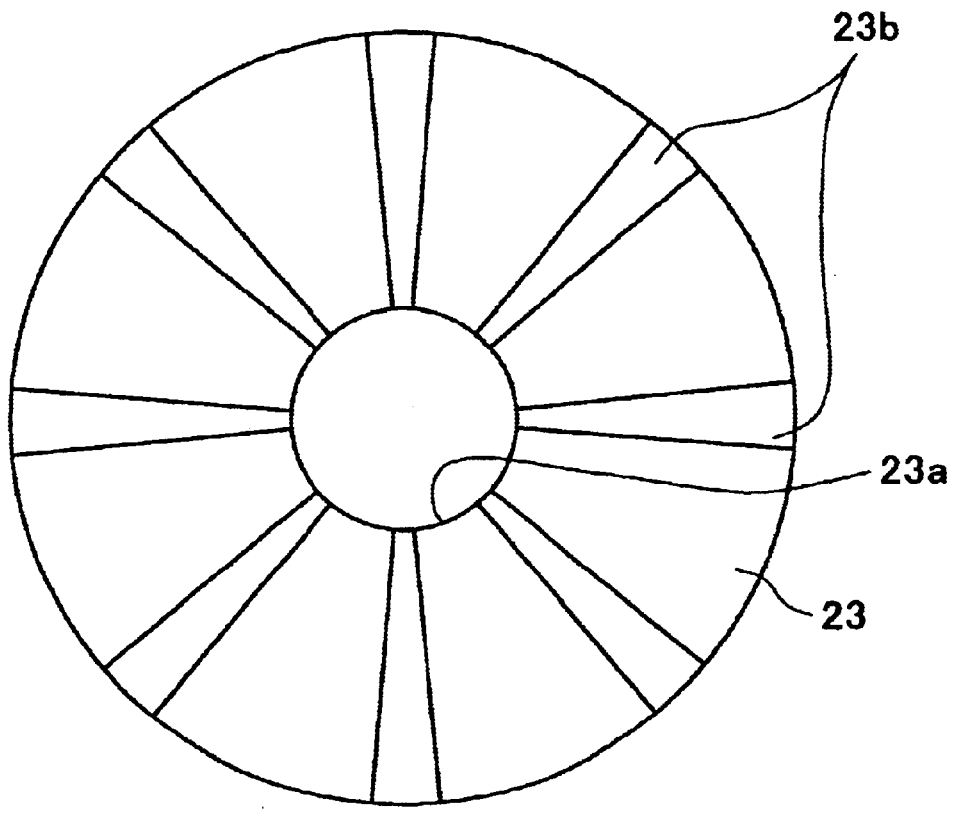
FIG. 3A is a bottom view of an example of a structure of an electrode plate 23.
Figure 3B:
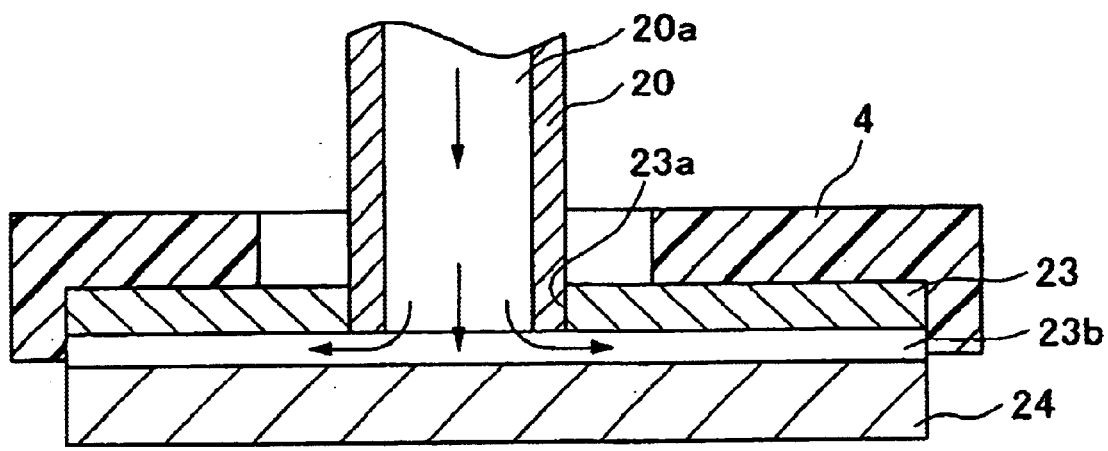
FIG. 3B is a sectional view of the positional relationship among the electrode plate 23, a conductive shaft 20, a scrub member 24, and an insulation member 4.

Here, FIG. 3A is a bottom view of an example of the structure of the electrode plate 23, and FIG. 3B is a sectional view of the positional relationships among the electrode plate 23, conductive shaft 20, scrub member 24, and insulation member 4.

As shown in FIG. 3A, a circular opening 23a is formed at the center portion of the electrode plate 23. A plurality of grooves 23b are formed radially extending in a radial direction of the electrode plate 23 around this opening 23a.

Further, as shown in FIG. 3B, the opening 23a of the electrode plate 23 has the lower end of the conductive shaft 20 fitted and fixed to it.

By employing such a configuration, the slurry and the electrolyte fed through a feed nozzle 20a formed at the center of the conductive shaft 20 are diffused through the grooves 23b over the entire surface of the scrub member 24. Namely, when the slurry and the electrolyte are fed to the upper surface of the scrub member 24 through the feed nozzle 20a formed at the center of the conductive shaft 20 during rotation of the electrode plate 23, conductive shaft 20, scrub member 24, and the insulation member 4, the slurry and the electrolyte spread to the entire upper surface of the scrub member 24.

Note that the scrub member 24 and the feed nozzle 20a of the conductive shaft 20 correspond to a concrete example of the polishing agent feeding means and the electrolyte feeding means of the present invention. Further, the electrode plate 23, conductive shaft 20, and the rotary joint 15 correspond to a concrete example of the power supplying means of the present invention.

The scrub member 24 adhered to the bottom surface of the electrode plate 23 is formed by a material capable of absorbing the electrolyte and the slurry and passing them from the upper surface to the lower surface. Further, this scrub member 24 forms a surface for scrubbing the wafer W by the contact of the surface facing the wafer W to the wafer W and is formed by for example a soft brush-like material, sponge-like material, or a porous material so as not to cause a scratch etc. in the surface of the wafer W. For example, there can be mentioned a porous body made of a resin such as a urethane resin, a melamine resin, an epoxy resin, or polyvinyl acetal (PVA).

The insulation plate 22 is formed by an insulation material such as a ceramic. This insulation plate 22 is connected to the main shaft 12a of the holder 12 by a plurality of rod-like connecting members 26. The connecting members 26 are arranged at equal intervals from the center axis of the insulation plate 22 at predetermined radial positions and held moveably with respect to the main shaft 12a of the holder 12. For this reason, the insulation plate 22 can move in the axial direction of the main shaft 12a. Further, the insulation plate 22 and the main shaft 12a are connected by a resilient member 25 made of for example a coil spring corresponding to each connecting member 26.

By employing a configuration in which the insulation plate 22 is made moveable with respect to the main shaft 12a of the holder 12 and in which the insulation plate 22 and the main shaft 12a are connected by the resilient member 25, when feeding high pressure air to the cylinder device 14 and moving the piston rod 14b downward in the direction indicated by the arrow A2, the pressing member 21 pushes the insulation plate 22 downward against a recovery force of the resilient member 25, and the scrub member 25 moves downward together with this. When stopping the feed of the high pressure air to the cylinder device 14, the insulation plate 22 rises due to the recovery force of the resilient member 25 and the scrub member 24 rises together with this.

The polishing tool 3 is tightly fixed to an annular lower end surface 4b of the flange member 4. This polishing tool 3 is formed in the shape of a wheel and provided with an annular polishing surface 3a at its lower end surface. The polishing tool 3 has conductivity and is preferably formed by a relatively soft material. For example, it can be formed by a porous body made of carbon with a binder matrix (binding agent) itself which has conductivity or a resin such as a melamine resin, epoxy resin, or polyvinyl acetal (PVA) containing a conductive material such as sintered copper or a metal compound.

The polishing tool 3 is directly connected to the flange member 4 having conductivity and supplied with power from the conductive brush 27 contacting the flange member 4.

Namely, the conductive member 28 provided at the main shaft motor 13 and the side surface of the holder 12 is electrically connected to the minus pole of the electrolytic power supply 61, while the conductive brush 27 provided in the conductive member 28 is in contact with the upper end surface 4c of the flange member 4. Due to this, the polishing tool 3 is electrically connected to the electrolytic power supply 61 via the conductive member 28, conductive brush 27, and the flange member 4.

Figure 4:
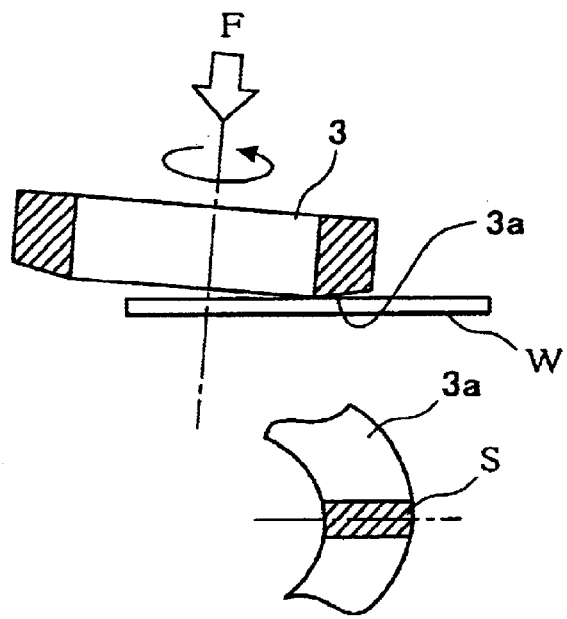
FIG. 4 is a view of the relationship between a polishing tool and a wafer.

In the polishing tool 3, for example, as shown in FIG. 4, the polishing surface 3a is inclined with respect to the center axis with a minute angle. Further, the main shaft 12a of the holding member 12 is inclined with respect to the main surface of the wafer W in the same way as the inclination of the polishing surface 3a. For example, by adjusting an attachment posture of the holding member 12 to the Z-axis slider 16, minute inclination of the main shaft 12a can be created.

Figure 5A:
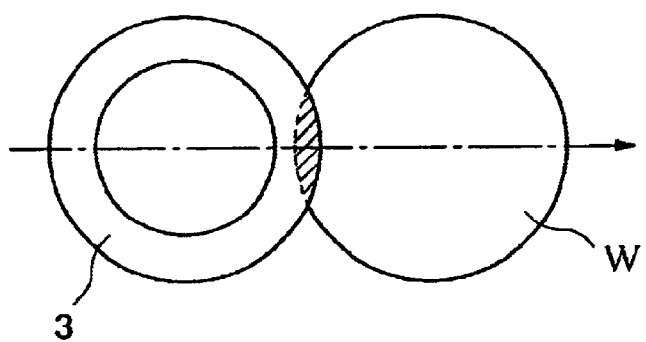
Figure 5B:
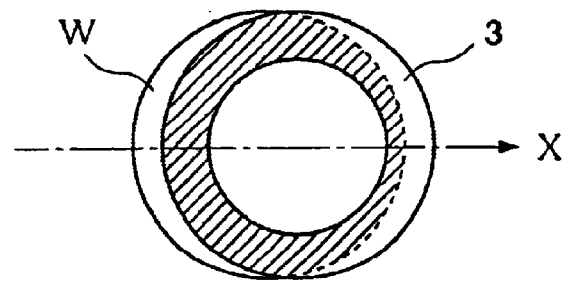

In this way, by making the center axis of the polishing tool 3 incline with respect to the main surface of the wafer W with a minute angle, when pushing the polishing surface 3a of the polishing tool 3 against the wafer W with a predetermined polishing pressure F, an effective action region S of the polishing surface 3a with respect to the wafer W becomes a straight line like region extending in the radial direction of the polishing tool 3 as shown in FIG. 4. For this reason, when moving the wafer W in the X-axial direction with respect to the polishing tool 3 to make it descend for the polishing, the area of the effective action region S becomes substantially constant during the period of movement from the state of FIG. 5A to the state of FIG. 5B.

The polishing apparatus 1 according to the present embodiment makes part of the polishing surface 3a of the polishing tool 3 partially act upon the surface of the wafer W, uniformly scans the valid action region S on the surface of the wafer W, and uniformly polishes the entire surface of the wafer W.

The electrolytic power supply 61 is a device for applying a predetermined voltage between the rotary joint 15 and the conductive brush 12 described above. By the application of voltage between the rotary joint 15 and the conductive brush 12, a potential difference occurs between the polishing tool 3 and the scrub member 24.

As the electrolytic power supply 61, it is preferable to use not a constant voltage source for continuously outputting a constant voltage, but a DC power supply including for example a switching regulator circuit for outputting voltage in the form of a pulse at a constant cycle.

Concretely, use is made of a power supply for outputting the pulse-like voltage at the constant cycle and capable of suitably changing the pulse width. As an example, use was made of one having an output voltage of DC 150 V and a maximum output current of 2 to 3 A and capable of changing the pulse width to either of 1, 2, 5, 10, 20, or 50 $\mu$s.

The pulse-like voltage output having a short width as described above is set in order to make the amount of electrolytic elution per pulse very small. Namely, it is effective for achieving a continuity of small elutions for preventing or suppressing as much as possible a sudden huge elution of the metal film in the form of a crater, for example, a discharge due to a sudden change of an inter-electrode distance seen in the unevenness of the metal film formed on the surface of the wafer W or in a case of contact or the like and a spark discharge due to a sudden change of an electrical resistance occurring when air bubbles, particles, or the like are interposed.

Further, the output voltage is relatively high in comparison with the output current, therefore a certain safety margin can be set in setting the inter-electrode distance. Namely, even if the inter-electrode distance slightly changes, since the output voltage is high, the change in the current value is small.

The electrolytic power supply 61 is provided with an ammeter 62 as a current detecting means of the present invention. This ammeter 62 is provided so as to monitor the electrolytic current flowing through the electrolytic power supply 61 and outputs a monitored current value signal 62s to the controller 55.

Further, the electrolytic power supply 61 is provided with a resistance meter 63 as a resistance value detecting means of the present invention. This resistance meter 63 is provided for monitoring the electric resistance between the polishing tool 3 and the electrode plate 23 through the surface of the wafer W based on the current flowing to the electrolytic power supply 61 and outputs a monitored electric resistance value signal 63s to the controller 55.

The slurry feeder 71 feeds the slurry to a feed nozzle 20a of the conductive shaft 20. As the slurry, for polishing a metal film, for example use is made of one comprised of an aqueous solution having oxidizing power based on hydrogen peroxide, iron nitrate, potassium iodate, etc. to which aluminum oxide (alumina), cerium oxide, silica, germanium oxide, or the like is added as the polishing abrasive. Further, the polishing abrasive is positively charged in advance in order to improve the dispersability and maintain a colloidal state.

The electrolyte feeder 81 feeds an electrolyte EL to the polishing head 11. The electrolyte EL is a solution made of a solvent and a solute dissociated into ions. As this electrolyte, use can be made of for example an aqueous solution comprised of a nitrate or a chloride system adjusted by a reducing agent.

The controller 55 has the function of controlling the entire polishing apparatus 1. Specifically, it outputs a control signal 51s to the main shaft driver 51 to control the rotation speed of the polishing tool 3, outputs a control signal 52s to the Z-axis driver 52 to control the positioning of the polishing tool 3 in the Z-axial direction, outputs a control signal 53s to the table driver 53 to control the rotation speed of the wafer W, and outputs a control signal 54s to the X-axis driver 54 to control the speed of the wafer W in the X-axial direction.

Further, the controller 55 controls the operation of the electrolyte feeder 81 and the slurry feeder 71 to control the feeding operation of the electrolyte EL and the slurry SL to the polishing head 2.

Further, the controller 55 is able to control the output voltage of the electrolytic power supply 61, the frequency of the output pulse, the width of the output pulse, etc.

Further, the controller 55 receives as input a current value signal 62s and an electric resistance value signal 63s from the ammeter 62 of the electrolytic power supply 61 and the resistance meter 63. The controller 55 is able to control the operation of the polishing apparatus 1 based on these current value signal 62s and electric resistance value signal 63s. Specifically, it controls the Z-axis servo motor 18 by using the current value signal 62s as a feedback signal so that the electrolytic current obtained from the current value signal 62s becomes constant or controls the operation of the polishing apparatus 1 so as to stop the polishing based on the current value or the electric resistance value specified by the current value signal 62s or the electric resistance value signal 63s.

A control panel 56 connected to the controller 55 is used for inputting a variety of data by an operator or displaying the monitored current value signal 62s and electric resistance value signal 63s.

Next, an explanation will be made of the polishing operation by the polishing apparatus 1 by taking as the example a case where the metal film formed on the surface of the wafer W is polished. Note that an explanation will be made of a case where a metal film made of for example copper is formed on the surface of the wafer W.

First, the wafer W is chucked on the wafer table 45, and the wafer table 45 is driven to make the wafer W rotate at a predetermined rotation speed.

Further, the wafer table 45 is moved in the X-axial direction, the polishing tool 3 attached to the flange portion 4 is positioned at a predetermined position above the wafer W, and the polishing tool 3 is rotated at the predetermined rotation speed. When the polishing tool 3 is rotated, the insulation plate 22, electrode plate 23, and scrub member 24 connected to the flange portion 4 are driven to rotate. Further, the pressing member 21 pressing against the scrub member 24, piston rod 14b, piston 14a, and the conductive shaft 20 simultaneously rotate.

From this state, when the slurry SL and the electrolyte EL are fed to the feed nozzle 20a in the conductive shaft 20 from the slurry feeder 71 and the electrolyte feeder 81, the slurry SL and the electrolyte EL are fed from the entire surface of the scrub member 24.

The polishing tool 3 is made to move downward in the Z-axial direction and the polishing surface 3a of the polishing tool 3 is brought into contact to the surface of the wafer W and pressed by a predetermined polishing pressure.

Further, the electrolytic power supply 61 is activated, a minus potential is applied to the polishing tool 3 through the conductive brush 27, and a plus potential is applied to the scrub member 24 through the rotary joint 15.

Further, high pressure air is fed to the cylinder device 14 to move the piston rod 14b downward in the direction indicated by the arrow A2 of FIG. 1, and the bottom surface of the scrub member 24 is moved up to the position to be brought into contact or proximity,with the wafer W.

The wafer table 45 is moved in the X-axial direction with a predetermined speed pattern from this state, whereby the entire surface of the wafer W is uniformly polished.

Figure 7:
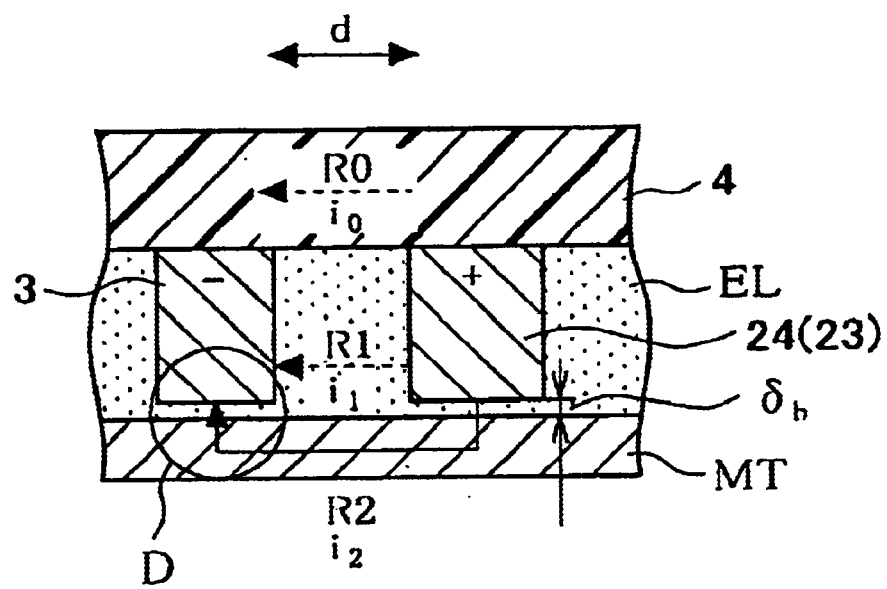
FIG. 7 is a view of the relationship between the polishing tool and an electrode plate.
Figure 8:
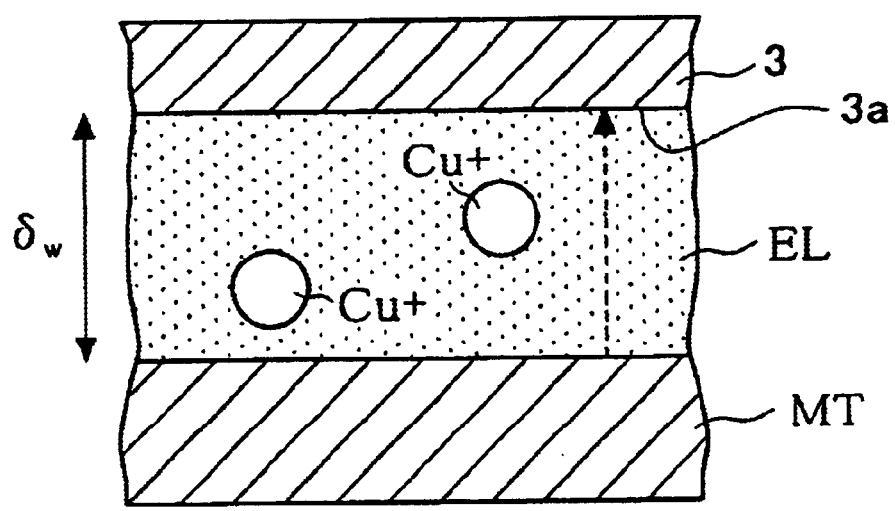
FIG. 8 is a diagram for explaining an electrolytic polishing function of the polishing apparatus of the present invention.

Here, FIG. 6 is a schematic view of a state where the polishing tool 3 is made to move downward in the Z-axial direction in the polishing apparatus 1 to be brought into contact with the surface of the wafer W, FIG. 7 is an enlarged view of the area in a circle C of FIG. 6, and FIG. 8 is an enlarged view of the area in a circle D of FIG. 7.

As shown in FIG. 7, the scrub member 24 carries current as the anode to the metal film MT formed on the wafer W via the electrolyte EL fed onto the wafer W or by direct contact. Further, the polishing tool 3 carries current as the cathode to the metal film MT formed on the wafer W via the electrolyte EL fed onto the wafer W or by direct contact. Note that, as shown in FIG. 7, there is a gap δb between the metal film MT and the scrub member 24. Further, as shown in FIG. 8, there is a gap δw between the metal film MT and the polishing surface 3a of the polishing tool 3.

As shown in FIG. 7, the insulation plate 4 is interposed between the polishing tool 3 and the scrub member 24 (electrode plate 23), but the resistance R0 of the insulation plate 4 is very large. Accordingly, the current i0 flowing from the scrub member 24 via the insulation plate 4 to the polishing tool 3 is substantially zero. No current flows to the polishing tool 3 from the scrub member 24 via the insulation plate 4.

For this reason, the current flowing from the scrub member 24 to the polishing tool 3 is branched into a current ii which directly flows through a resistance R1 in the electrolyte EL to the polishing tool 3 and a current $i_2$ which flows from an interior of the electrolyte EL through the metal film MT made of copper formed on the surface of the wafer W to the electrolyte EL again and to the polishing tool 3.

When the current $i_2$ flows in the surface of the metal film MT, the copper comprising the metal film MT is ionized by the electrolytic action of the electrolyte EL and eluted into the electrolyte EL.

Here, the resistance R1 in the electrolyte EL becomes extremely large in proportion to a distance d between the scrub member 24 as the anode and the polishing tool 3 as the cathode. For this reason, by making the inter-electrode distance d sufficiently larger than the gap δb and the gap δw, the current i1 which directly flows through the resistance R1 in the electrolyte EL to the polishing tool 3 becomes very small, the current i2 becomes large, and almost all of the electrolytic current passes through the surface of the metal film MT. For this reason, the electrolytic elution of the copper comprising the metal film MT can be efficiently carried out.

Further, the magnitude of the current i2 changes according to the size of the gap δb and the gap δw, therefore, as mentioned above, by adjusting the size of the gap δb and the gap δw by controlling the position of the polishing tool 3 in the Z-axial direction by the controller 55, the current i2 can be made constant. The size of the gap δw can be adjusted possible by controlling the Z-axis servo motor 18 by using the current value signal 62s as a feedback signal so that the electrolytic current obtained from the current value signal 62s, that is, the current i2, becomes constant.

Further, the positioning precision of the polishing apparatus 1 in the Z-axial direction is a sufficiently high resolution of 0.1 μm. In addition, the main shaft 12a is inclined with respect to the main surface of the wafer W at a fine angle, so the effective contact area S is always maintained constant, therefore if the value of the electrolytic current is controlled constant, the current density can be made always constant and also the amount of electrolytic elution of the metal film can be made always constant.

As described above, the polishing apparatus 1 having the above configuration is provided with an electrolytic polishing function for eluting and removing the metal comprising the metal film MT formed on the wafer W by the electrolytic action by the electrolyte EL.

Further, the polishing apparatus 1 having the above configuration is provided with a chemical mechanical polishing function of the usual CMP apparatus by the polishing tool 3 and the slurry SL in addition to this electrolytic polishing function, so it is also possible to polish the wafer W by the combined action of the electrolytic polishing function and chemical mechanical polishing (hereinafter referred to as electrolytic composite polishing).

Further, it is also possible for the polishing apparatus 1 having the above configuration to perform the polishing by the combined action of the mechanical polishing of the polishing surface 3a of the polishing tool 3 and the electrolytic polishing function without the use of the slurry SL.

The polishing apparatus 1 having the above configuration can polish the metal film by the combined action of the electrolytic polishing and the chemical mechanical polishing, therefore can remove the metal film with a much higher efficiency in comparison with a polishing apparatus using only chemical mechanical polishing or mechanical polishing. A high polishing rate with respect to the metal film can be obtained, therefore it becomes possible to keep the polishing pressure F of the polishing tool 3 with respect to the wafer W low in comparison with a polishing apparatus using only chemical mechanical polishing or mechanical polishing and the occurrence of dishing and erosion can be suppressed.

Below, the explanation will be made of a polishing method using the electrolytic composite polishing function of the polishing apparatus 1 according to the present embodiment by taking as an example the case where it is applied to a process of formation of an interconnection by the dual damascene process in a semiconductor device of a multilayer interconnection structure.

Figure 9:
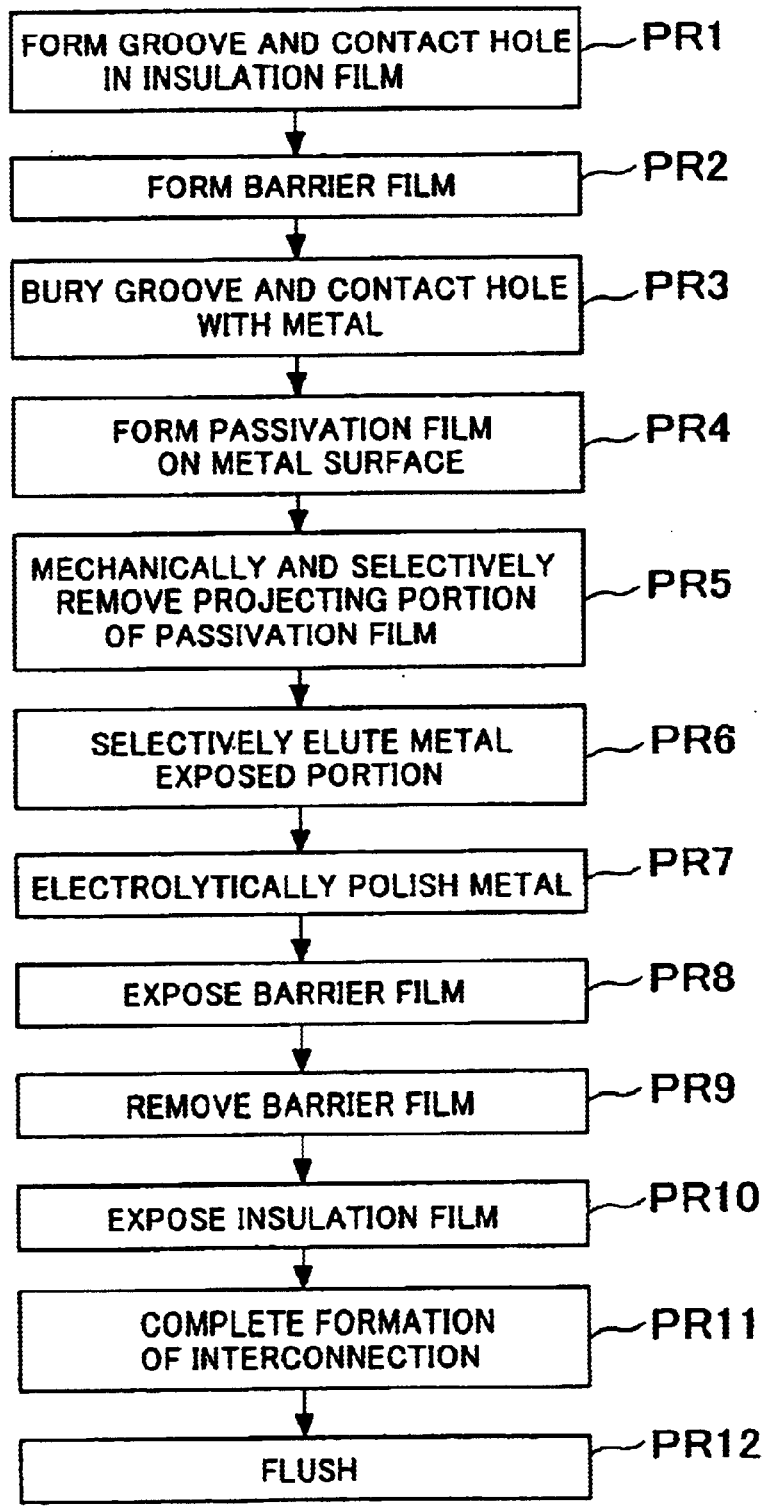
FIG. 9 is a process chart of a manufacturing process according to an embodiment of the method of production of a semiconductor device of the present invention.

FIG. 9 is a process chart of a manufacturing process according to a method for producing the semiconductor device of an embodiment of the present invention. The manufacturing process according to the present embodiment will be explained based on the process chart of FIG. 9.

Figure 10:
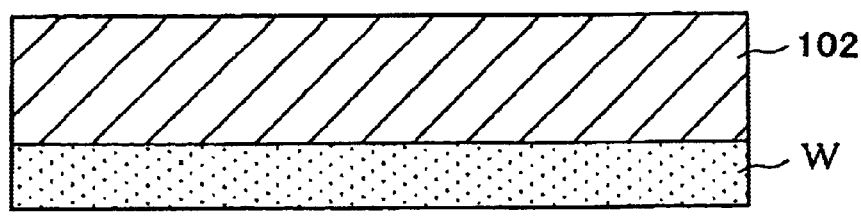
FIG. 10 is a sectional view of a manufacturing process of the method of production of a semiconductor device of the present invention.

First, as shown in FIG. 10, for example an inter-layer insulation film 102 made of for example a silicon oxide film ($SiO_2$) is formed by a low pressure chemical vapor deposition (CVD) process by using for example tetraethyl orthosilicate (TEOS) as the reaction source on a wafer W made of silicon or another semiconductor on which a not illustrated impurity diffusion region is suitably formed.

Figure 11:
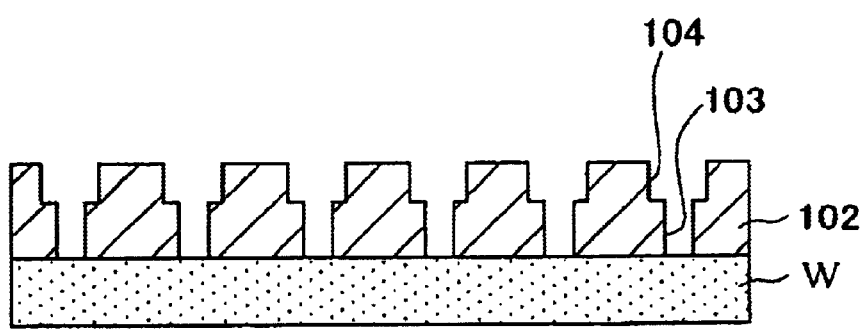
FIG. 11 is a sectional view of a manufacturing process continued from FIG. 10.

Then, as shown in FIG. 11, contact holes 103 communicating with the impurity diffusion region of the wafer and interconnection use grooves 104 in which a predetermined pattern of interconnections to be electrically connected to the impurity diffusion region of the wafer W are to be formed are formed by using a well known photolithography technique and etching technique. Note that the depth of the interconnection use grooves 104 is for example about 800 nm.

Figure 12:
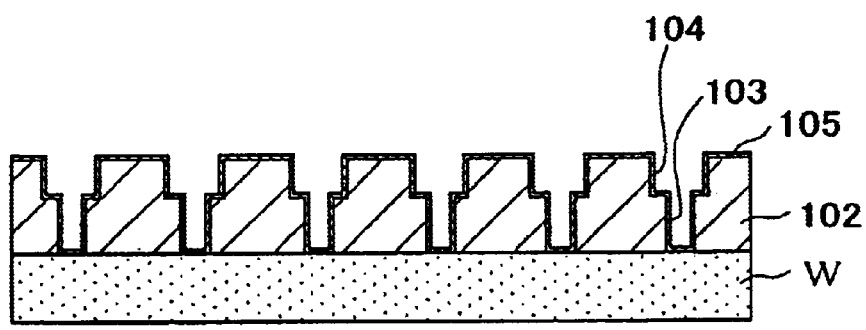
FIG. 12 is a sectional view of a manufacturing process continued from FIG. 11.

Next, as shown in FIG. 12, a barrier film 105 is formed on the surface of the inter-layer insulation film 102 and in the contact holes 103 and the interconnection use grooves 104. This barrier film 105 is formed by a material such as Ta, Ti, TaN, or TiN to a thickness of for example about 15 nm by a physical vapor deposition (PVD) process using a sputtering device, a vacuum vapor deposition device, or the like. The barrier film 105 is provided in order to prevent the diffusion of the material comprising the interconnections in the inter-layer insulation film 102 and increase the adhesion with the inter-layer insulation film 102. Particularly, when the interconnection material is copper and the inter-layer insulation film 102 is a silicon oxide film, the copper has a large diffusion coefficient to the silicon oxide film and can be easily oxidized, so this is prevented. The process up to the above is a process PR1 shown in FIG. 9.

Figure 13:
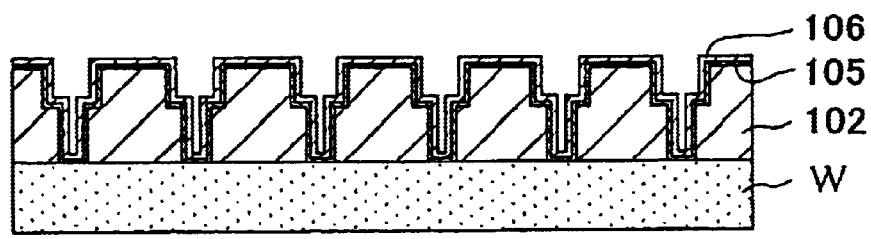
FIG. 13 is a sectional view of a manufacturing process continued from FIG. 12.

Next, as shown in FIG. 13, a seed film 106 made of a material the same as the material for forming the interconnections, for example, copper is formed on the barrier film 105 to a thickness of for example about 150 nm by the well known sputtering process (process PR2). The seed film 106 is formed so as to promote the growth of copper grains when burying the interconnection use grooves and the contact holes with copper.

Figure 14:
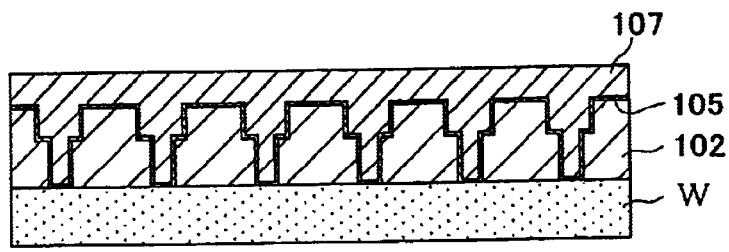
FIG. 14 is a sectional view of a manufacturing process continued from FIG. 13.

Next, as shown in FIG. 14, a metal film 107 made of copper is formed on the barrier film 105 to a thickness of for example about 2000 nm so as to bury the contact holes 103 and the interconnection use grooves 104. The metal film 107 is preferably formed by an electrolytic plating process or an electroless plating process, but it is also possible to form the metal film by the CVD process, sputtering process, or the like. Note that the seed film 106 is integrally formed with the metal film 107 (process PR3).

Figure 15:
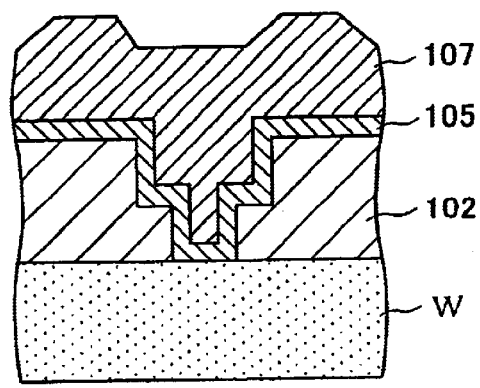
FIG. 15 is an enlarged view of a sectional structure of the semiconductor device shown in FIG. 14.

Here, FIG. 15 is an enlarged view of the cross-section of the semiconductor device in the middle of the manufacturing process in which the metal film 107 is formed on the barrier film 105.

As shown in FIG. 15, due to the burying of the contact holes 103 and the interconnection use grooves 104, unevenness having a height of for example about 600 nm is caused on the surface of the metal film 107.

The above process is carried out by a process similar to the related art, but in the polishing method of the present invention, the excess metal film 107 and barrier film 105 present on the inter-layer insulation film 102 is removed not by chemical mechanical polishing, but by electrolytic composite polishing of the polishing apparatus 1.

Figure 16:
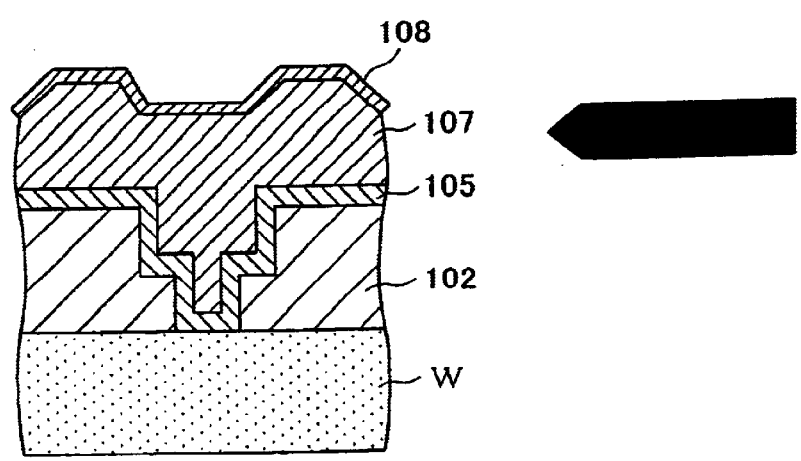
FIG. 16 is a sectional view of a manufacturing process continued from FIG. 14.

Further, with the polishing method of the present invention, before the process by the electrolytic composite polishing, as shown in FIG. 16, a passivation film 108 is formed on the surface of the metal film 107 (process PR4).

This passivation film 108 is a film made of a material exhibiting an action preventing the electrolytic reaction of the metal (copper) comprising the metal film 107.

The method for forming the passivation film 108 forms an oxide film by coating an oxidizing agent on the surface of for example the metal film 107. When the metal comprising the metal film 107 is copper, the copper oxide (CuO) becomes the passivation film 108.

Further, as another method, it is also possible to form the passivation film 108 by forming any of for example a water repelling film, an oil film, an antioxidation film, a film made of a surfactant, a film made of a chelating agent, and a film made of a silane coupling agent on the surface of the metal film 107.

The type of the passivation film 108 is not particularly limited, but use is made of one having a high electric resistance with respect to the metal film 107, a relatively low mechanical strength, and a brittle nature.

Next, in the polishing method of the present invention, only the passivation film 108 formed on the projecting portions of the metal film 107 is selectively removed (process PR5).

The passivation film 108 is selectively removed by the polishing apparatus 1. Note that, as the slurry SL to be used, use is made of a slurry having a high polishing rate with respect to copper. For example, use is made of one comprised of an aqueous solution based on for example hydrogen peroxide, iron nitrate, or the potassium iodate to which an alumina-, silica-, or manganese-based polishing abrasive is added.

First, the wafer W is chucked to the wafer table 42 of the polishing apparatus 1, the polishing tool 3 and the scrub member 24 rotating while feeding the electrolyte. EL and the slurry SL onto the wafer W are made to move downward in the Z-axial direction to bring them into contact or proximity with the wafer W, and the wafer W is made to move in the X-axial direction with a predetermined speed pattern to thereby perform the polishing.

Further, a DC pulse voltage is applied between the polishing tool 3 and the electrode plate 23 by using the polishing tool 3 as the minus electrode and the electrode plate 23 as the plus electrode.

Note that it is also possible to feed only slurry SL onto the wafer W by imparting the function of the electrolyte EL to the aqueous solution forming the base of the slurry SL.

Figure 17:
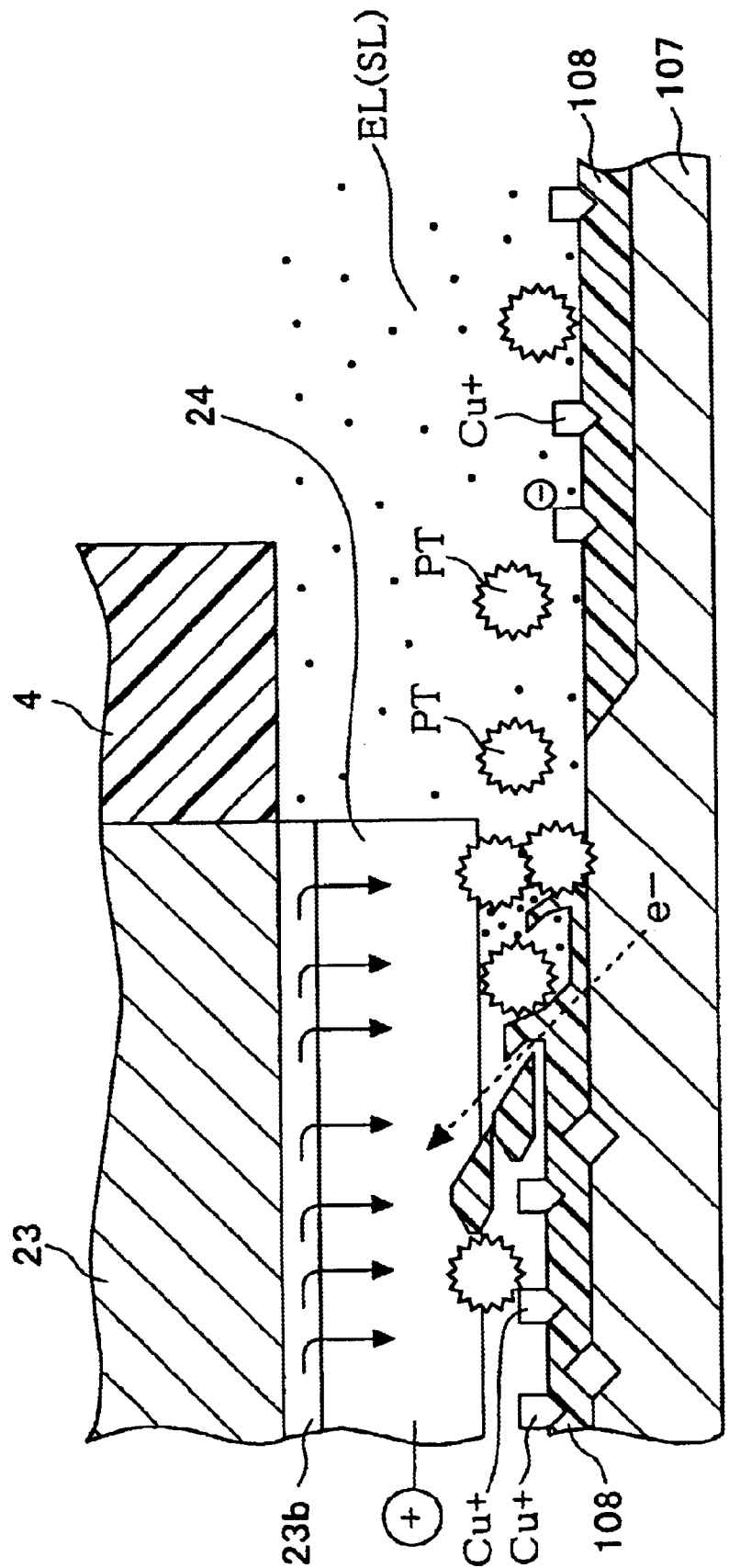
FIG. 17 is a conceptual view of a polishing process near the scrub member 24.
Figure 18:
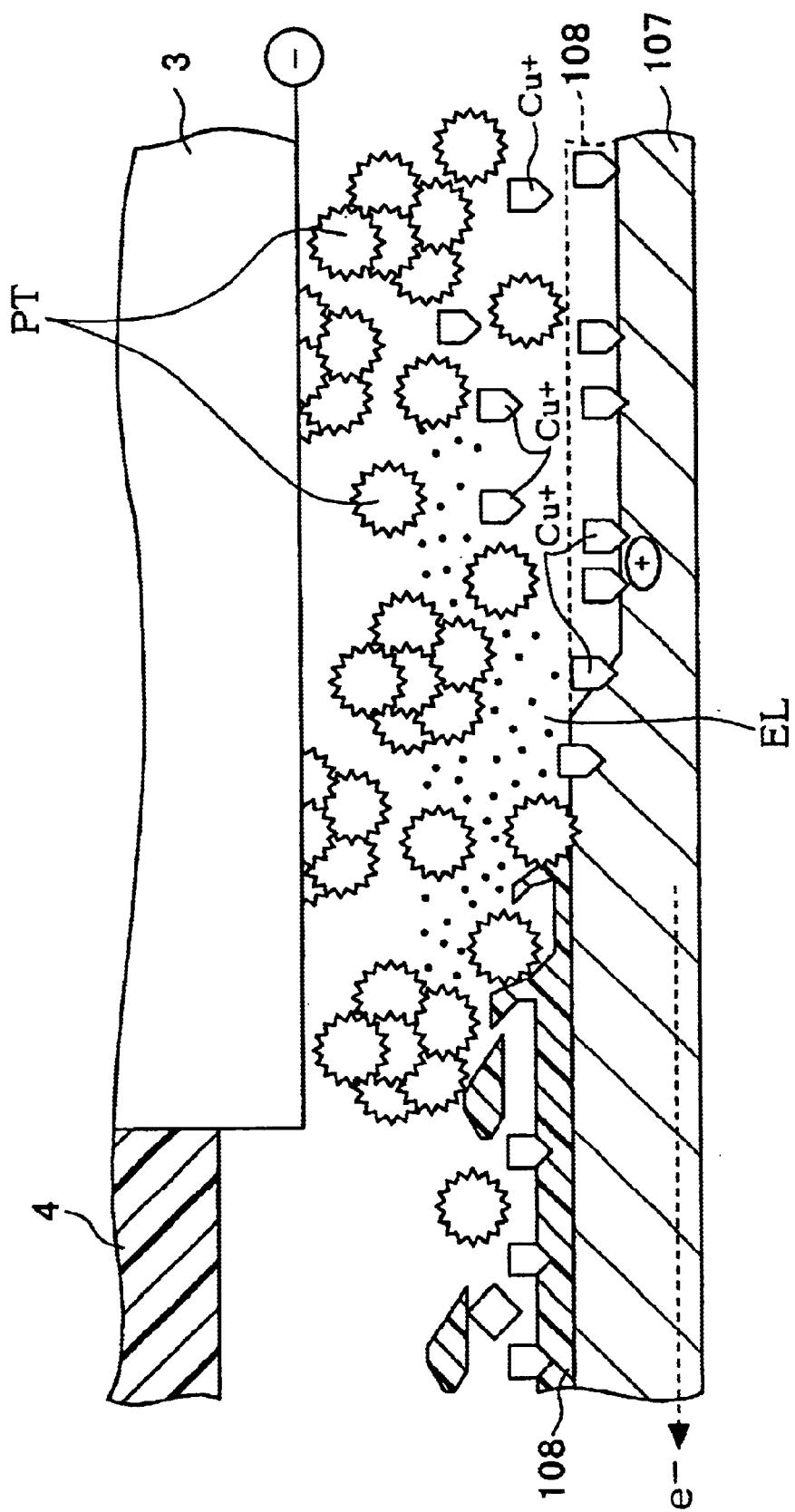
FIG. 18 is a conceptual view of a polishing process near a polishing tool 3.

Here, FIG. 17 is a conceptual view of the polishing process near the scrub member 24 in the above state, and FIG. 18 is a conceptual view of the polishing process near the polishing tool 3.

As shown in FIG. 17, near the scrub member 24, the slurry SL and the electrolyte EL are fed from the groove portions 23b of the rotating electrode plate 23. The slurry SL and the electrolyte EL pass through the scrub member 24 and are fed onto the wafer W from the entire surface of the scrub member 24.

The passivation film 108 formed on the metal film 107 is not affected by the electrolytic action by the electrolyte EL, therefore the elution of the copper comprising the metal film 107 into the electrolyte EL is suppressed. For this reason, almost no current flows in the metal film 107. The current value monitored by the ammeter 62 is low and stable as it is.

Figure 25:
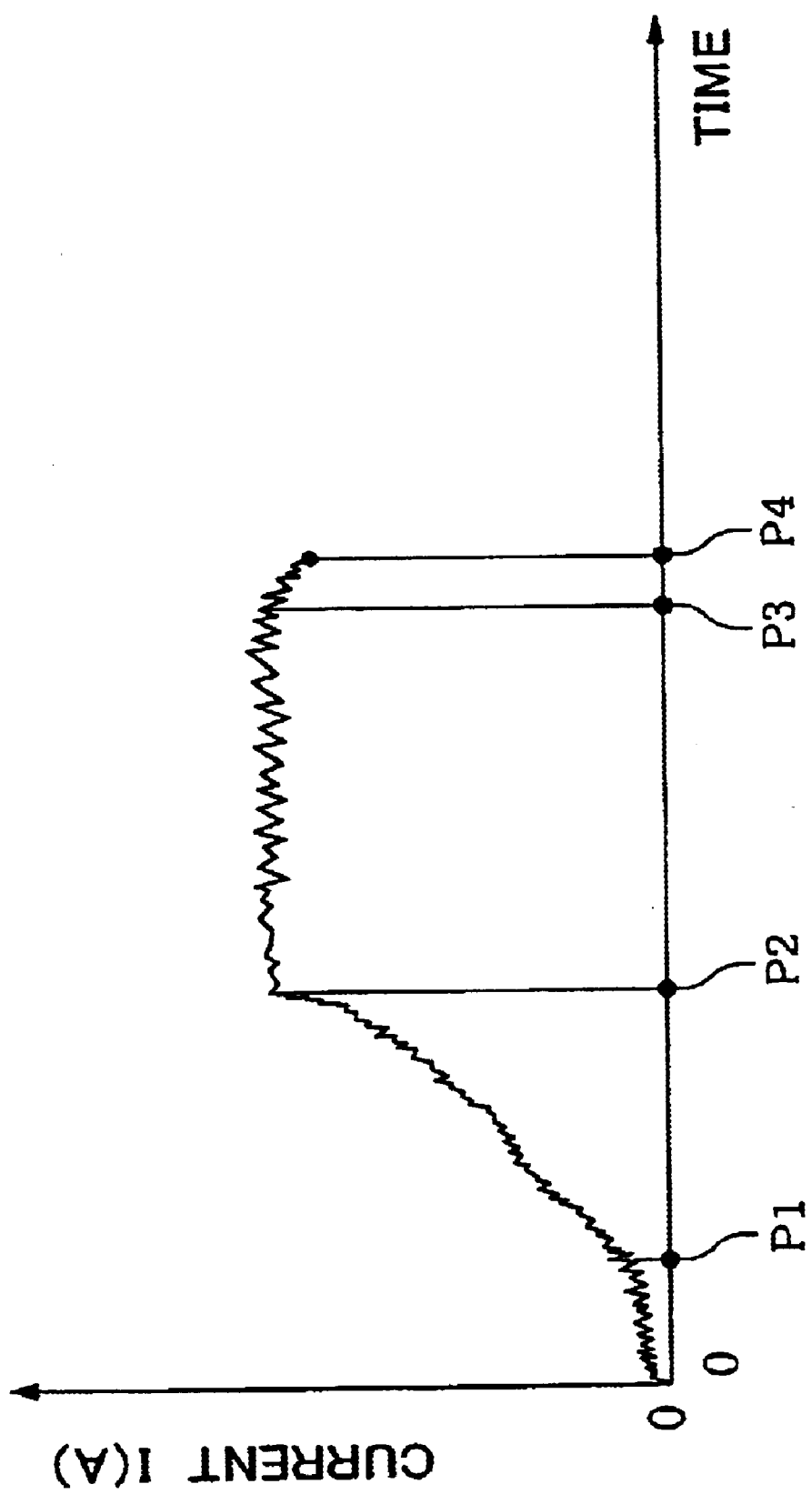
FIG. 25 is a graph of an example of a current value monitored in an electrolytic composite polishing process.

FIG. 25 is a graph of an example of the current value monitored by the ammeter 62 in the electrolytic composite polishing process of the present embodiment. The above state is exhibited near the start position of the current value shown in FIG. 25.

Due to the rotation of the scrub member 24, due to the mechanical removal action or the mechanical removal action of the polishing abrasive PT comprised of for example aluminum oxide contained in the slurry SL, high portions of the passivation film 108, that is, the passivation film 108 on the projecting portions of the metal film 107, are mechanically removed.

On the other hand, as shown in FIG. 18, near the polishing tool 3, the passivation film 108 present at the metal film 107 is removed from the higher portions by the mechanical removal action of the polishing tool 3 or the mechanical removal action of the polishing abrasive PT.

Figure 19:
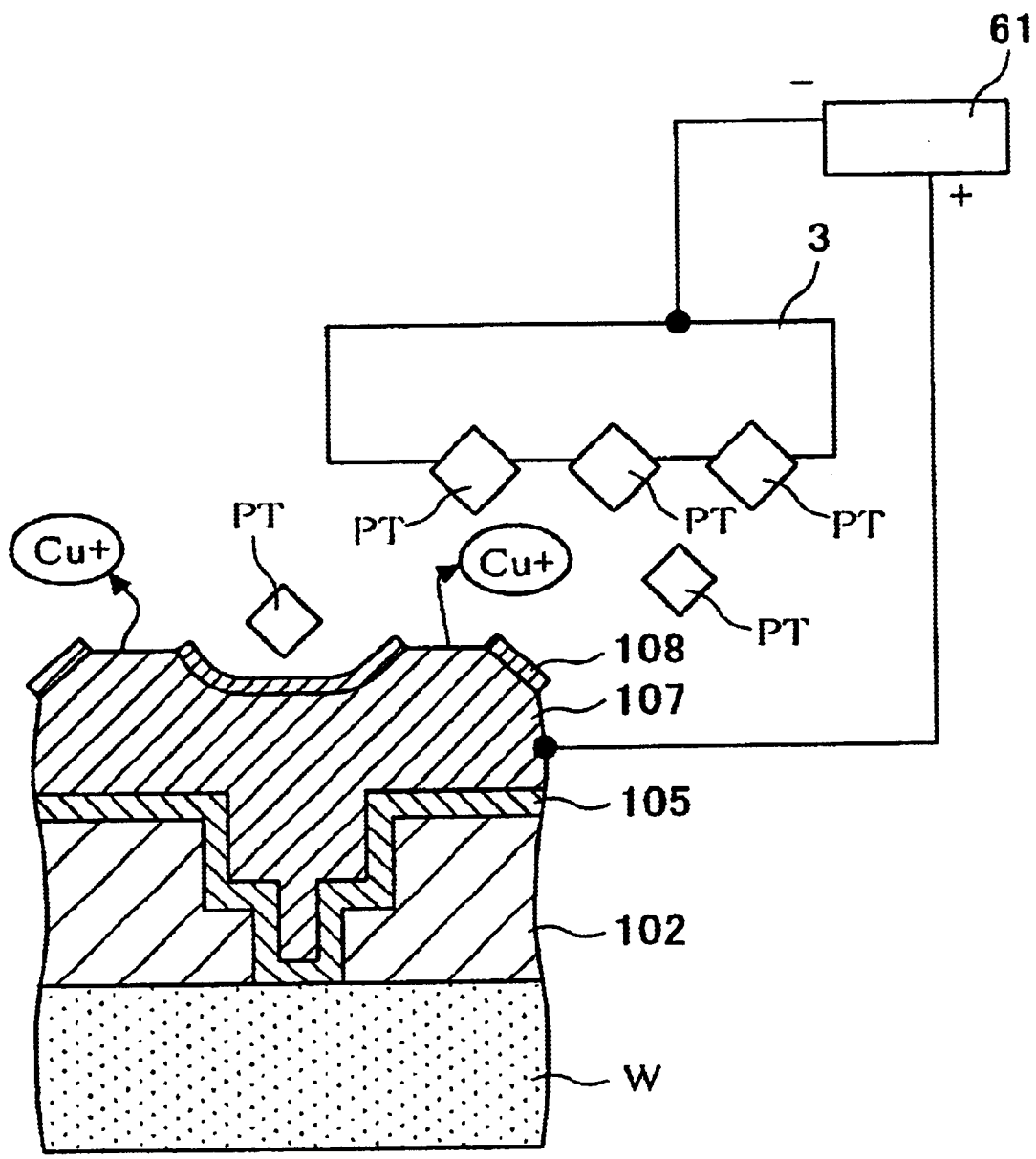
FIG. 19 is a sectional view of a manufacturing process continued from FIG. 16.

In this way, as shown in for example FIG. 19, when the passivation film 108 formed on the projecting portions of the metal film 107 is selectively removed, the metal film 107 is exposed at the surface from the portion where the passivation film 108 is selectively removed.

When the metal film 107 is exposed at the surface, the exposed portions of the metal film 107 forming the projecting portions are selectively eluted (process PR5).

In the action of the electrolyte EL at this time, as shown in FIG. 18, the copper comprising the metal film 107 at the portions from which the passivation film 108 is removed, that is, the projecting portions of the metal film 107, is eluted into the electrolyte EL as copper ions Cu+ by the electrolytic action. Due to this, minus electrons e− flow in the metal film 107. These minus electrons e− pass through the electrolyte EL from the surface of the metal film 107 and flow to the electrode plate 23 as shown in FIG. 17 and become the current $i_2$ described above.

As mentioned above, in the copper comprising the metal film 107, the electrical resistance is low and the current density is increased in comparison with the passivation film 108, therefore it is affected by a concentrated electrolytic action, selective elution occurs, and the removal of the material is accelerated.

Further, since current is carried via the electrolyte EL, when the potential difference between the metal film 107 as the anode and the polishing tool 3 as the cathode is constant, the shorter the inter-electrode distance, that is, the lower the electrical resistance value, the larger the value of the current flowing between the electrodes. For this reason, if there is a difference of the inter-electrode distance due to the unevenness of the metal film 107 as the cathode (the higher portions among the projecting portions of the metal film 107 have a shorter inter-electrode distance and lower electric resistance) with respect to the polishing tool 3 as the cathode, efficient flattening whereby the elution speed becomes larger from the higher portions due to the difference of the current density proceeds. At this time, as indicated by P1 in FIG. 25, the current value monitored by the ammeter 62 starts to rise.

Due to such an action, the projecting portions of the metal film 107 are flattened with a much higher efficiency in comparison with mechanical flattening.

Figure 20:
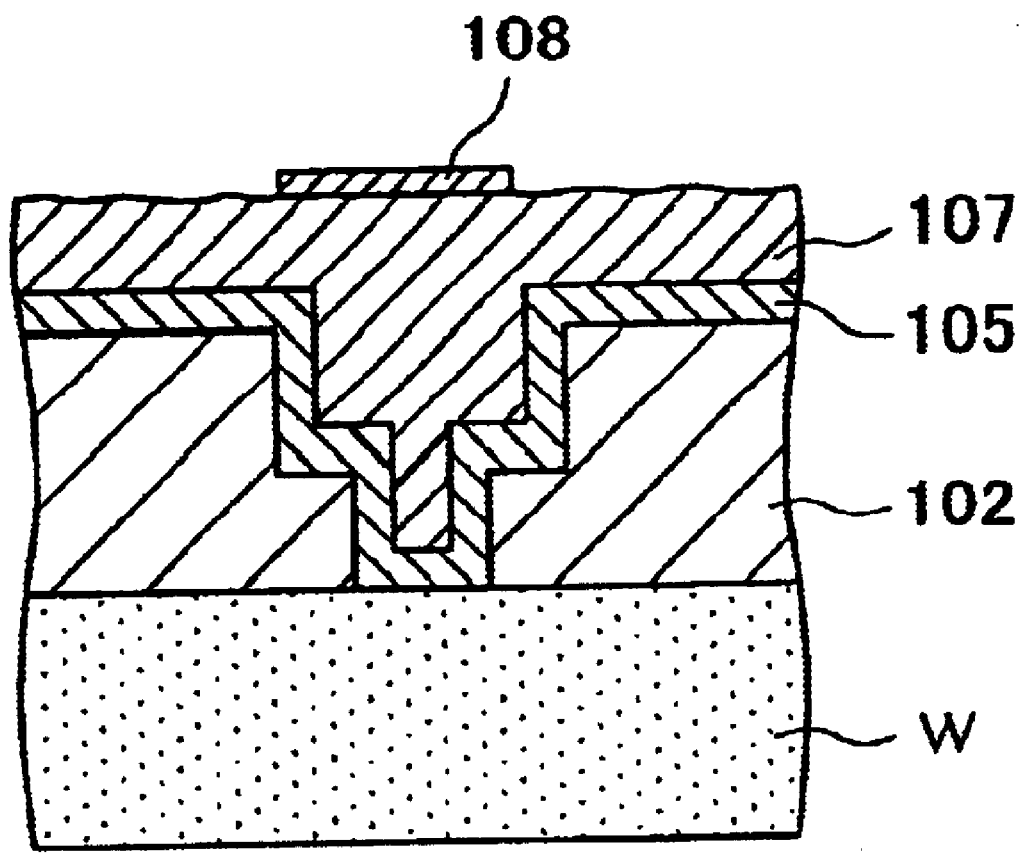
FIG. 20 is a sectional view of a state where a projecting portion of a metal film is selectively removed.

By the above action, the surface of the metal film 107 for which the selective electrolytic composite polishing is completed to an extent that the projecting portions of the metal film 107 are almost completely flattened becomes a composite surface of the passivation film 108 remaining at the portions which had been concave portions of the metal film 107 and the newly created surface of copper where the projecting portions of the metal film 107 are removed as shown in FIG. 20.

Figure 21:
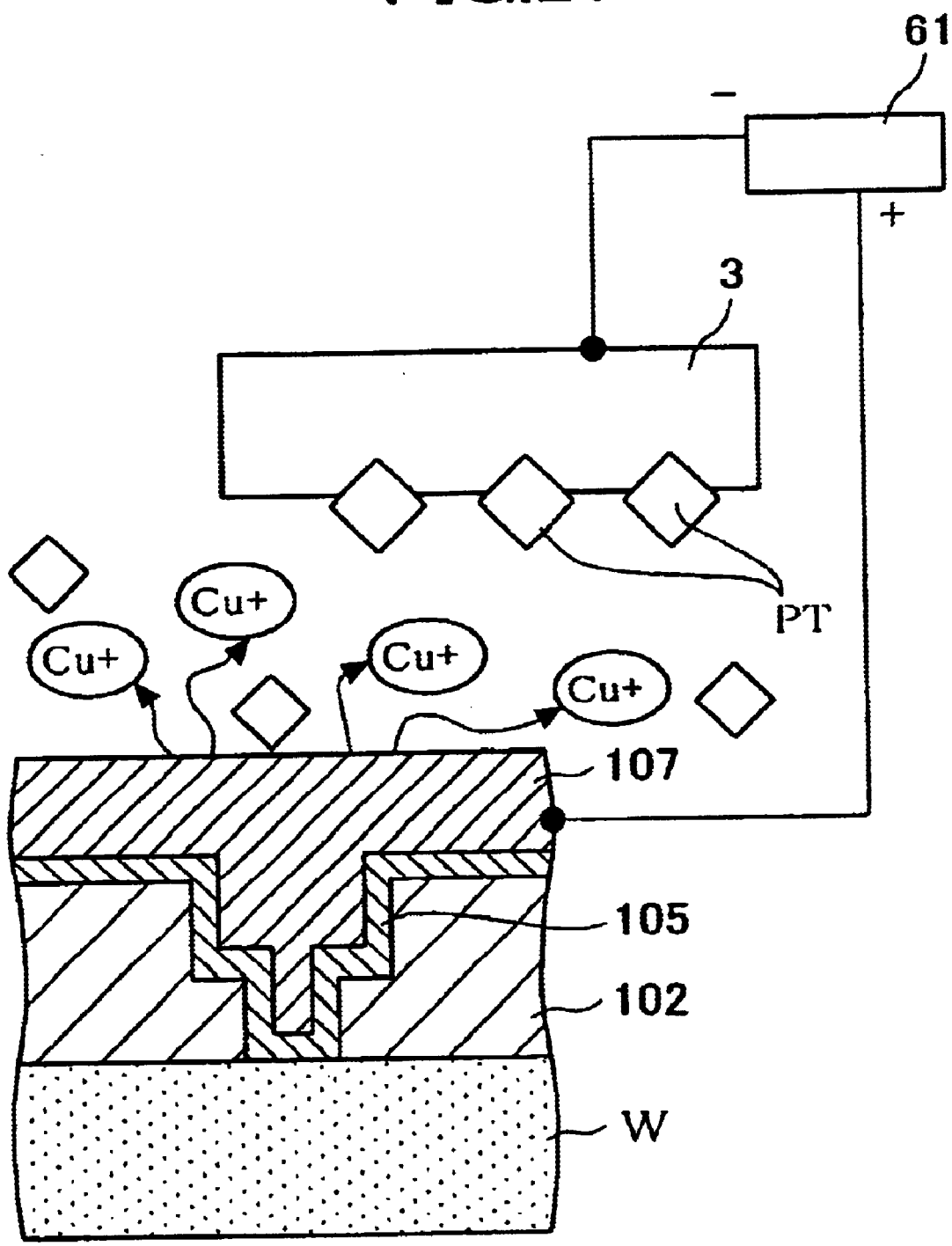
FIG. 21 is a sectional view of a manufacturing process continued from FIG. 19.

Next, as shown in FIG. 21, electrolytic composite polishing combining mechanical removal carried out by the polishing tool 3 and the polishing abrasive PT in the slurry SL and the electrolytic action by the electrolyte EL progresses on the surface of this metal film 107 (process PR7).

At this time, the mechanical strength of the remaining passivation film 108 is low in comparison with the newly created surface of copper as mentioned above, therefore when the passivation film 108 is polished by electrolytic composite polishing, it is mainly removed by the mechanical action, the copper surface existing under this is exposed, and the electrolytic action is increased in proportion to the area thereof.

The surface area of the copper comprising the metal film 107 becomes maximum at the point of time when the passivation film 108 is completely removed. Simultaneously with this, the current monitored by the ammeter 62 rises from the position of P1 in FIG. 25, rises along with the removal of the passivation film 108, and then gets becomes maximum at the point of time indicated by P2 where the surface area of the copper becomes the maximum. The processes up to here complete the flattening of the initial unevenness of the surface of the metal film 107.

In this way, the electrolytic composite polishing of the present embodiment is polishing in which the polishing rate is electrically and chemically assisted, therefore the polishing can be carried out by a low polishing pressure in comparison with the usual chemical mechanical polishing. This is very advantageous in view of the reduction of the scratches, performance in easing step differences, and the reduction of dishing and erosion even in comparison as simple mechanical polishing.

Further, the polishing can be carried out with a low polishing pressure. This is very advantageous when using organic low dielectric constant film or a porous low dielectric constant insulation film in which the mechanical strength is low and which are easily broken by the usual chemical mechanical polishing for the inter-layer insulation film 102.

Figure 22:
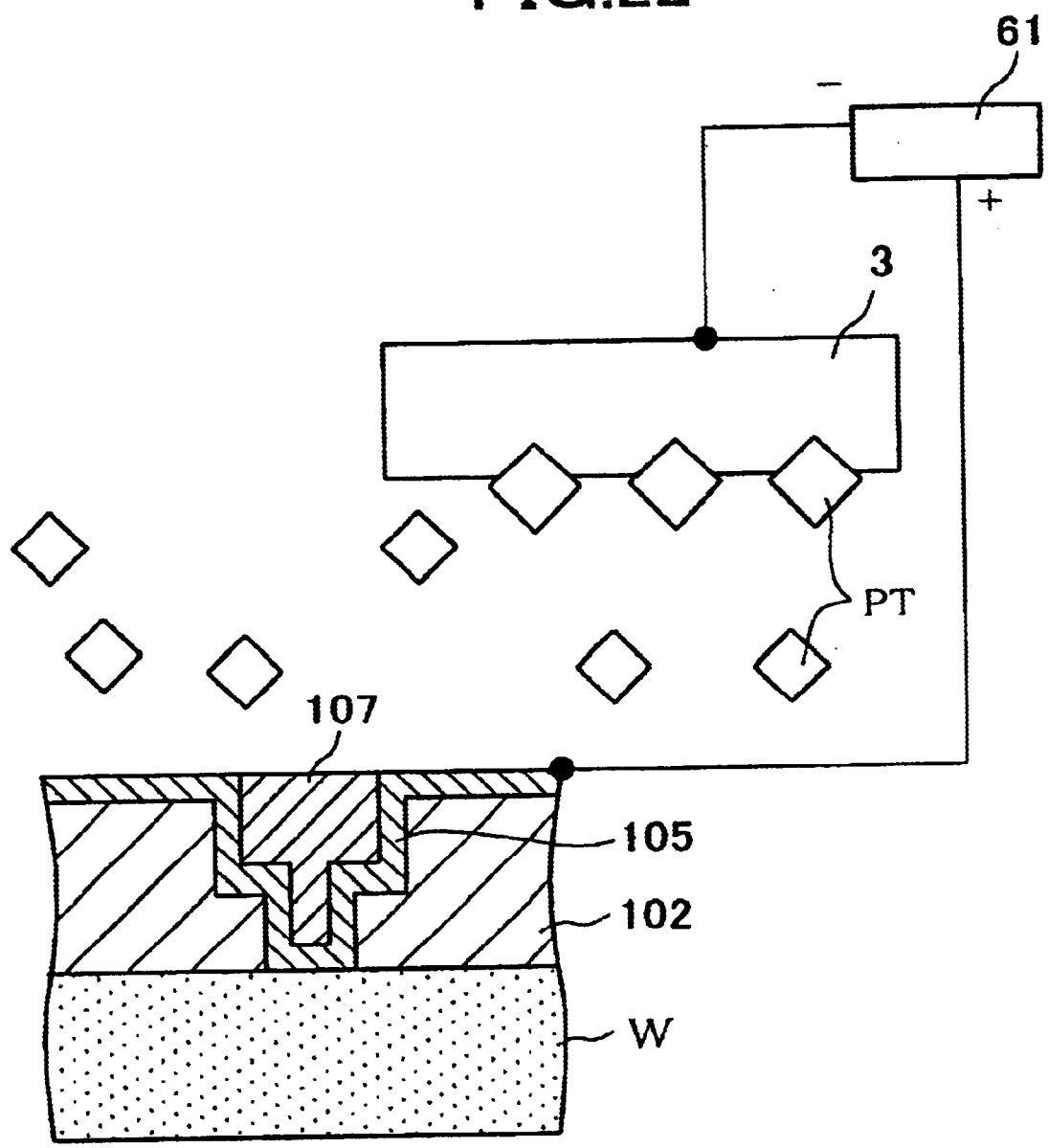
FIG. 22 is a sectional view of a manufacturing process continued from FIG. 21.

When the electrolytic composite polishing of the metal film 107 progresses and the excess metal film 107 is removed, as shown in FIG. 22, the barrier film 105 is exposed (process PR8).

At this time, the current monitored by the ammeter 62 becomes the maximum value from the point of time when the passivation film 108 on the metal film 107 indicated by P2 in FIG. 25 is all removed and becomes approximately a constant value up to the point of time when the barrier film 105 indicated by P3 in FIG. 25 is exposed.

When the barrier film 105 is exposed, when use is made of a material such as Ta, Ti, TaN, or TiN, the electrical resistance is larger in comparison with copper, therefore the current value monitored by the ammeter 62 starts to be lowered from the point of time indicated by P3 when the exposure of the barrier film 105 in FIG. 25 is commenced. In this state, a nonuniform amount of copper film of the metal film 107 remains. The polishing is once stopped in this state.

For the stoppage of this polishing, as indicated by P4 of FIG. 25, the controller 55 determines that the current value has fallen to the predetermined value and stops the polishing operation of the polishing apparatus 1.

Next, the barrier film 105 is removed (process PR9).

In the process for removing this barrier film 105, not a slurry SL having a high polishing rate with respect to the metal film 107 made of copper described above, but a slurry SL having a high polishing rate with respect to the barrier film 105 formed by a material such as Ta, TaN, Ti, or TiN, and having a low polishing rate with respect to the metal film 107 is used. Namely, use is made of a slurry SL having a selectivity of the polishing rate of the barrier film 105 and the metal film 107 as large as possible.

Further, from the viewpoint of suppressing the occurrence of dishing and erosion due to over polishing etc., the output voltage of the electrolytic power supply 61 is made smaller than that in the above process and then the polishing and removal of the barrier film 105 are carried out. Further, preferably also the polishing pressure of the polishing tool 3 is made smaller than that in the above process.

Further, when the output voltage of the electrolytic power supply 61 is made smaller and the barrier film 105 is removed, the inter-layer insulation film 102 is exposed at the surface, therefore the value of the electrolytic current becomes small, so the electric resistance is monitored between the scrub member 24 and the polishing tool 3 by the resistance meter 63 in place of the monitoring of the electrolytic current by the ammeter 62.

Figure 23:
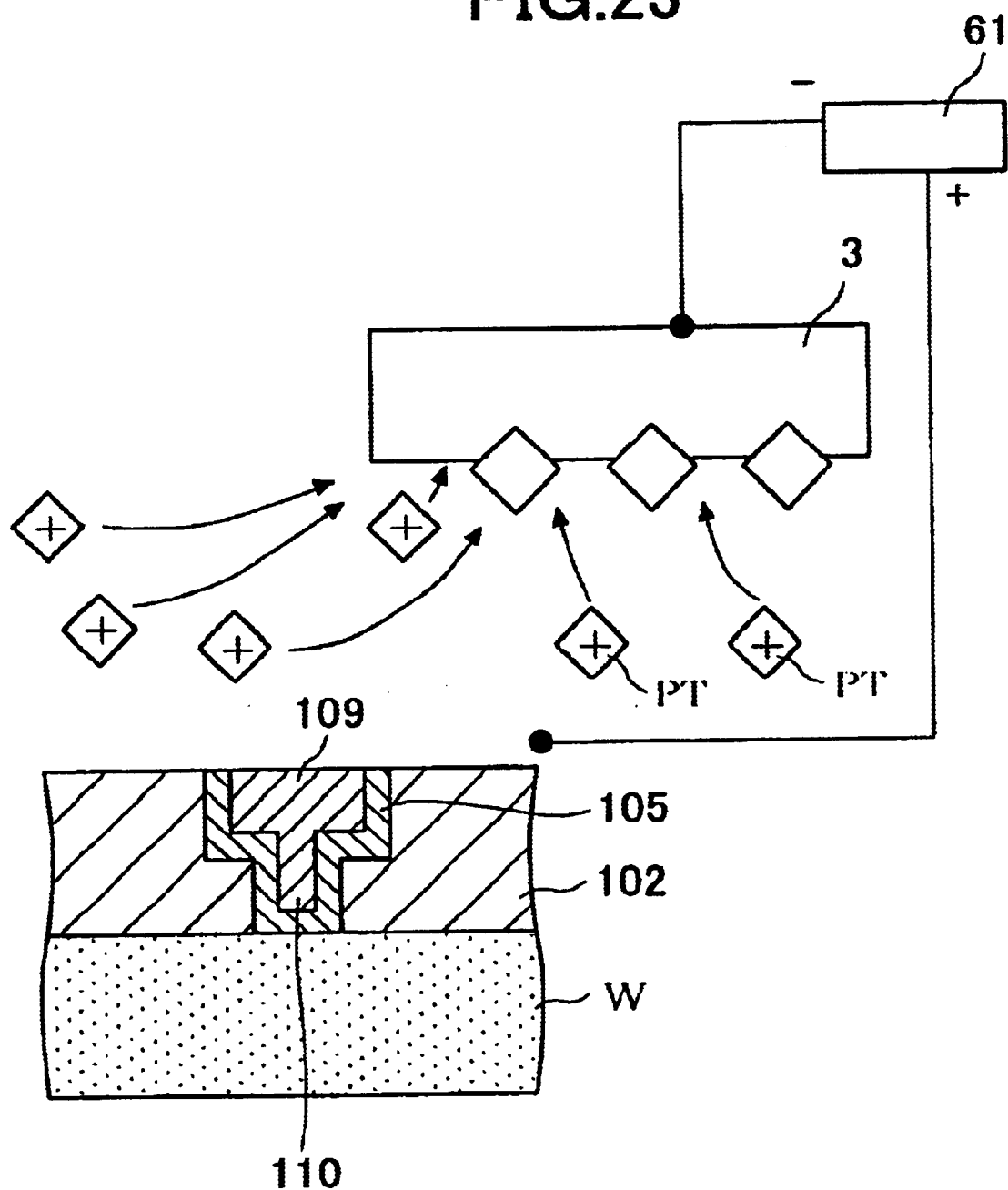
FIG. 23 is a sectional view of a manufacturing process continued from FIG. 22.

When the barrier film 105 is removed, as shown in FIG. 23, the inter-layer insulation film 102 is exposed at the surface (process PR10).

When the inter-layer insulation film 102 is exposed, as shown in FIG. 23, there is no metal film 107 and barrier film 105 at this exposed portion for carrying current to the surface as the anode, therefore the carrying of current by the scrub member 24 is shut off, and the electrolytic action at the exposed portion of the inter-layer insulation film 102 stops. At this time, the electric resistance value monitored by the resistance meter 63 starts to increase.

Here, between the portion where the metal film 107 remains and the exposed portion of the barrier film 105, similar to the case of easing the step difference of the projecting portions of the metal film 107, that is, a concentration of the current density at the portion where the metal film 107 remains occurs by using the barrier film 105 as the portion having a high electric resistance in place of the passivation film 108, and the remaining portion of the metal film 107 is selectively eluted and removed only the mechanical action of material removal by the polishing tool 3 and the slurry SL subjectively acts on the portion where the electrolytic action stops.

In usual chemical mechanical polishing, the polishing rate selectivity of the barrier film 105 and the metal film 107 with respect to the inter-layer insulation film 102 is made as large as possible so as to ensure a dimensional precision of the top surface of the inter-layer insulation film 102 using that rate difference as a safety margin. For this reason,-dishing of the metal film 107 cannot be avoided.

Further, if the selectivity is set low, dishing can be reduced to a certain extent, but the dimensional precision depends upon the uniformity of distribution of the amount of removal in the wafer plane. Therefore there also occurs a case where the removal of the barrier film 105 and the metal film 107 is not sufficient. For this reason, in order to prevent the state where the barrier film 105 and the metal film 107 remain at the top surface of the inter-layer insulation film 102, that is, under polish, over polish of the amount of the nonuniformity of the amount of removal in the plane becomes necessary, and degradation of erosion due to this over polish cannot be essentially avoided.

On the other hand, in the present embodiment, if uniformity inside the plane of the wafer W can be secured to a certain extent, the barrier film 105 remaining on the inter-layer insulation film 102 or the remaining portion of the metal film 107 are highly efficiently removed since the electrolytic action acts thereon. The elution stops from the exposed portion of the inter-layer insulation film 102. For this reason, the dimensional precision of the inter-layer insulation film 102 is automatically secured, and the occurrence of dishing and erosion is suppressed.

As described above, a barrier film 105 formed by a material such as Ta, TaN, Ti, or TiN can be completely removed and, at the same time, occurrence of dishing and erosion due to over polish can be suppressed.

Further, in the removal process of the barrier film 105 mentioned above, by setting an absolute current value low and a mechanical load light, the removal speed becomes slower, but if the metal film 107 made of the copper film of the remaining amount of the portion where the remaining film thickness is nonuniform is small, since the barrier film 105 is thin in comparison with the metal film 107, the amount of removal per se of the barrier film 105 is small, therefore even if there is variation and nonuniformity in this process, the absolute value of the dishing and erosion can be made to a negligible small extent and the processing time can be shortened.

Further, since the polishing method according to the present embodiment is composite polishing of mechanical polishing plus an electrochemical action, the flattened surface suffers from little damage and thus a surface smooth can be obtained mechanically.

Next, based on the electric resistance value monitored by the resistance meter 63, the process for removing the barrier film 105 is terminated at the point of time when the electric resistance value is the maximum value, that is, the formation of the interconnections is completed (process PR11). The controller 55 determines the value of the electric resistance value and stops the polishing operation of the polishing apparatus 1.

Note that, before terminating the polishing, in the state where the electrolytic action is added as it is, by making the polishing tool 3 pass above the surface of the wafer W at a distance of about for example 100 $\mu$m without contacting the surface thereof, a damage free surface obtained by only electrolytic action without mechanical polishing can be formed.

Due to this, as shown in FIG. 23, interconnections 109 and contacts 110 are finally formed in the inter-layer insulation film 102.

Then, the semiconductor device in which the interconnections 109 and the contacts 110 are formed is flushed (process PR12).

Figure 24:
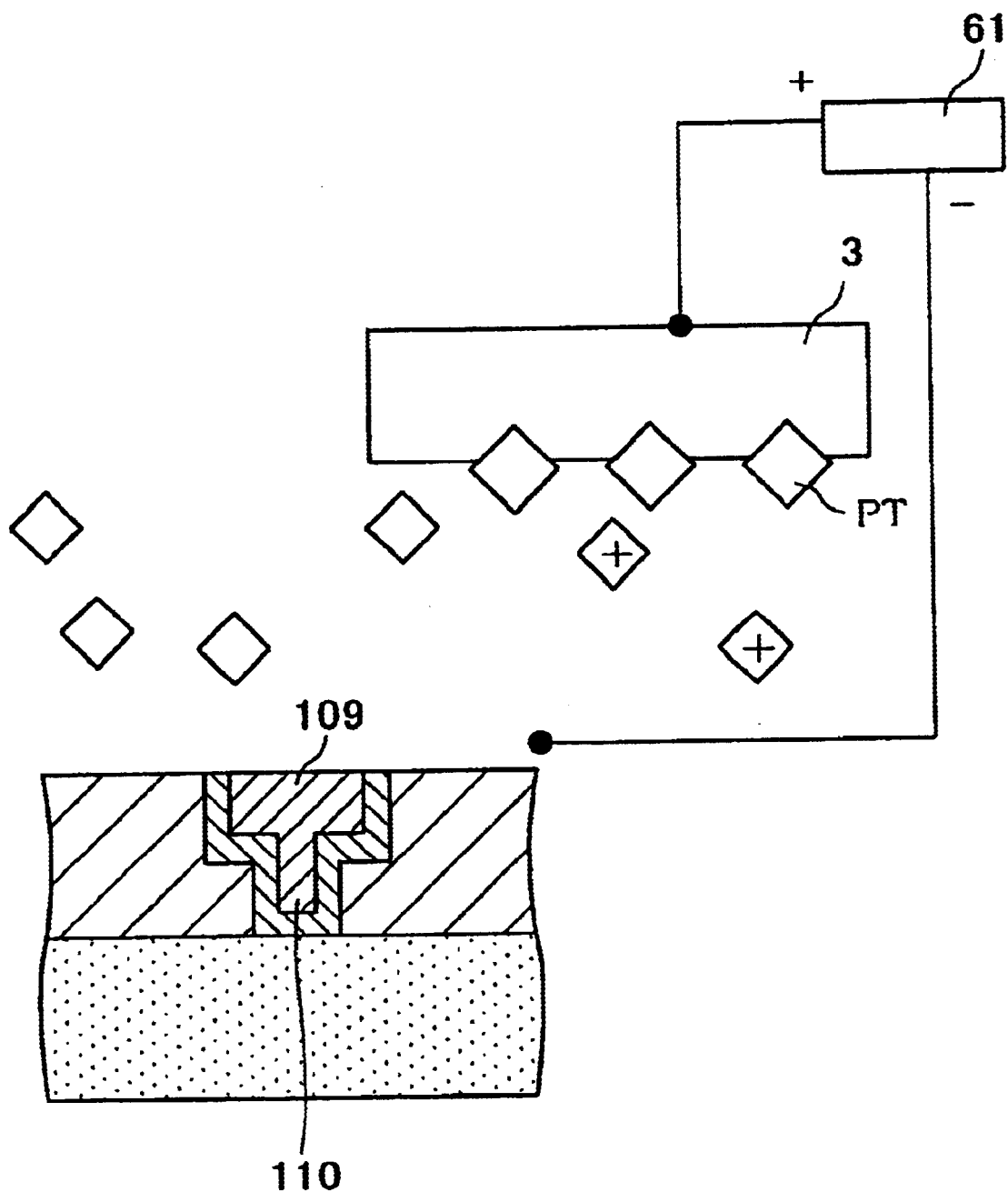
FIG. 24 is a sectional view of a state where the semiconductor device finished being polished is flushed.

In this flushing process, immediately after the interconnections 109 and the contacts 110 are formed, as shown in FIG. 24, a plus pulse voltage is applied to the polishing tool 3 while feeding a washing chemical and antioxidant to the surface of the wafer W but without conducting current to the wafer W and the surface is cleaned with pure water and cleaned with chemicals to remove the slurry SL and particles present at the surface of the wafer W.

In the present embodiment, before the flushing, a polishing abrasive PT made of for example alumina contained in the slurry SL is charged positive in order to enhance the dispersability, therefore even in a case where the particles mechanically strike the surface of the metal film 107 made of copper and contribute to the removal and then remain without wear, they are not buried in the surface of the copper comprising the metal film 107 as the anode and, as shown in FIG. 23, re-adhere to the surface of the polishing tool 3 as the cathode and contribute to the next polishing. Further, the positively charged particles are attracted to the surface of the polishing tool 3 as the cathode, therefore they will not be buried in the surface of the copper.

On the other hand, the negatively charged particles remaining at the surface of the wafer W can be removed from the surface of the wafer W by the flushing.

Further, they can be similarly removed also in the case of using a slurry SL in which the polishing abrasive PT is negatively charged.

When the interconnection forming material is copper, it is easily oxidized, therefore it is necessary to remove the metal ions or particles without altering the copper surface, but in the present embodiment, this problem is solved by charging the polishing abrasive PT positive in advance and then flushing the surface.

Note that, as the polishing abrasive, aluminum oxide (alumina) was mentioned as an example, but the same applies to the case where cerium oxide, silica, germanium oxide, or the like is used.

As described above, according to the method for producing a semiconductor device according to the present embodiment, the passivation film 108 is formed on the metal film 107 for burying the interconnection use grooves and the contact holes formed in the insulation film 102, the passivation film 108 formed at the projecting portions of the metal film 107 is selectively removed, and the metal film 107 exposed at the surface is selectively removed by electrolytic polishing using the remaining passivation film 108 as a mask and then concentratedly removed by concentration to the current density, whereby the initial unevenness can be flattened much more efficiently in comparison with usual CMP.

Further, since the metal film 107 in which the initial unevenness is flattened is removed by the electrolytic composite polishing combining electrolytic polishing and chemical mechanical polishing, the excess metal film 107 can be removed with much higher efficiency in comparison with the usual CMP. For this reason, even if the polishing pressure of the polishing tool 3 is set low, a sufficient polishing rate is obtained, the damage to the metal film 107 can be reduced, and, at the same time, the occurrence of dishing and erosion can be suppressed.

Further, according to the method for producing a semiconductor device according to the present embodiment, at the point of time when the excess metal film 107 is removed and the barrier film 105 is exposed, the polishing is stopped, the slurry SL is changed to a material having a high polishing rate with respect to the barrier film 105, and the polishing conditions such as the output voltage of the electrolytic power supply 61 are changed to remove the excess barrier film 105, therefore the excess barrier film 105 can be reliably removed. Even in the case where over polish is necessary, the amount of dishing and erosion can be kept small.

Further, according to the method for producing a semiconductor device according to the present embodiment, the metal film is highly efficiently polished by the electrolytic composite polishing, therefore the polishing pressure of the polishing tool 3 can be made low, so even in a case where for example use is made of an organic low dielectric constant film or a porous low dielectric constant insulation film having a relatively low mechanical strength as the inter-layer insulation film 102 in order to reduce the dielectric constant from the viewpoints of lowering the power consumption and the increasing the speed, the damage to these insulation films can be reduced.

In the above embodiment, the absolute value of the amount of polishing of the metal film can be controlled by the cumulative amount of the electrolytic current and the time by which the polishing tool 3 passes over the wafer W.

In the above embodiment, the explanation was made of the case of the interconnection forming process using copper, but the present invention is not limited to this and can be applied to interconnection forming processes using various metals, for example, tungsten, aluminum, or silver.

Further, in the above embodiment, the explanation was made of the case of the electrolytic composite polishing combining chemical mechanical polishing using the slurry SL and electrolytic polishing using the electrolyte EL, but the present invention is not limited to this. Namely, in the present invention, it is also possible to perform the electrolytic composite polishing by electrolytic polishing of the electrolyte EL and mechanical polishing by the polishing surface 3a of the polishing tool 3 without the use of the slurry SL.

Further, in the above embodiment, the value of the current flowing between the polishing tool 3 and the electrode plate 23 was monitored, and the polishing process until the barrier film 105 was exposed was managed based on this value, but it is also possible to manage all polishing processes by the monitored current value.

Similarly, in the above embodiment, the electric resistance value between the polishing tool 3 and the electrode plate 23 was monitored, and only the removal process of the barrier film 105 was managed based on this value, but it is also possible to manage all polishing processes by the monitored electric resistance value.

Modification 1

Figure 26:
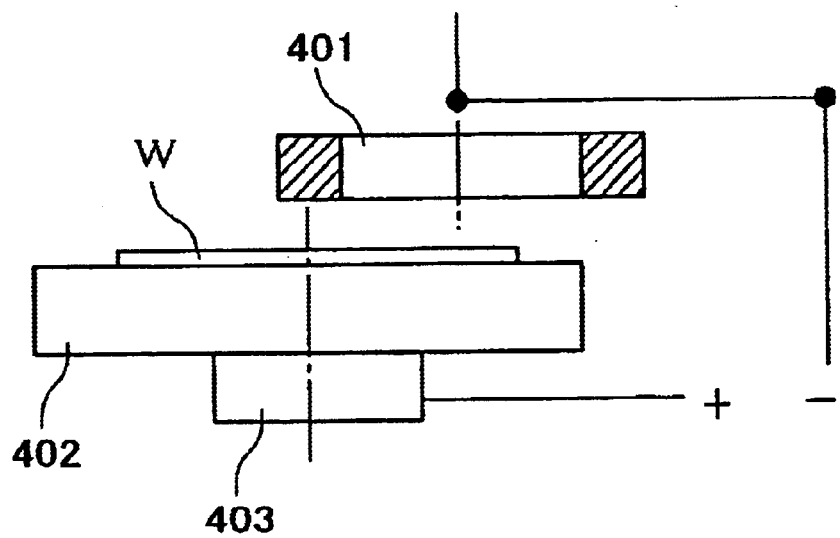
FIG. 26 is a view of a modification of the polishing apparatus of the present invention.

FIG. 26 is a schematic view of a polishing apparatus according to a modification of the present invention.

In the polishing apparatus 1 according to the embodiment mentioned above, current was conducted to the surface of the wafer W by the conductive plate 23 provided with the conductive polishing tool and the scrub member 24.

As shown in FIG. 26, it is also possible to give the wheel-like polishing tool 401 conductivity in the same way as the case of the polishing apparatus 1 and to give conductivity to a wafer table 402 for chucking and rotating the wafer W. Power is supplied to the polishing tool 401 by a configuration similar to that of the embodiments.

In this case, in supplying current to the wafer table 402, electrolytic current can be supplied by providing a rotary joint 403 below the wafer table 402 and constantly maintaining the flow of current to the wafer table 402 rotating by the rotary joint 403.

Modification 2

Figure 27:
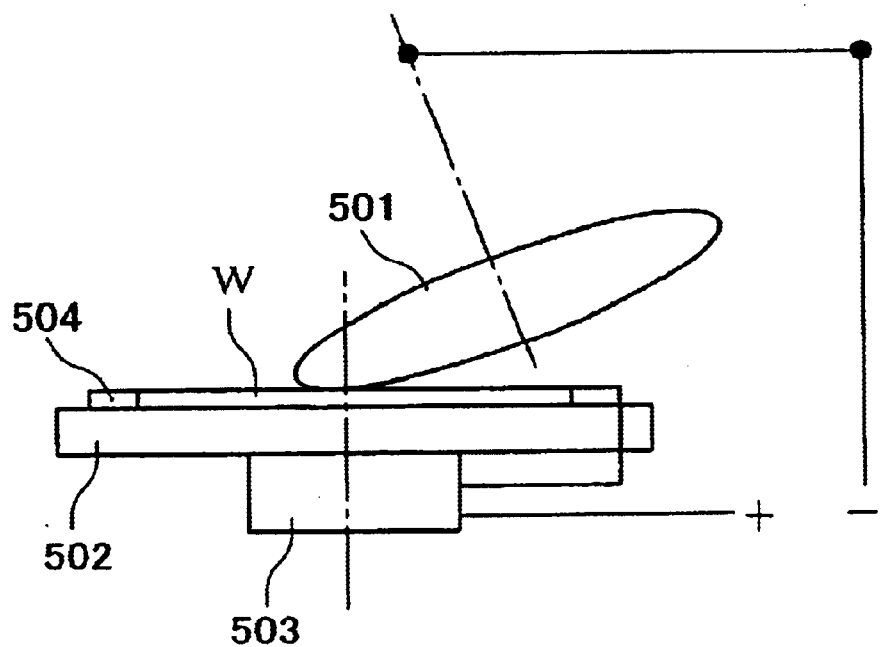
FIG. 27 is a view of still another modification of the polishing apparatus of the present invention.

FIG. 27 is a schematic view of a polishing apparatus according to another modification of the present invention.

A wafer table 502 for chucking and rotating the wafer W holds the wafer W by a retainer ring 504 provided on the periphery of the wafer W.

Conductivity is imparted to a polishing tool 501, conductivity is imparted to the retainer ring 504, and power is supplied to the polishing tool 501 by a configuration similar to that of the embodiments mentioned above.

Further, the retainer ring 504 is covered up to the barrier layer portion formed on the wafer W and supplied with current. Further, the retainer ring 504 is supplied with power through a rotary joint 503 provided below the wafer table 502.

Note that by making the amount of inclination of the polishing tool 3 larger so that a gap more than the thickness of the retainer ring 504 can be maintained at the edge portion even if the polishing tool 501 contacts the wafer W, interference between the polishing tool 501 and the retainer ring 504 can be prevented.

Modification 3

Figure 28:
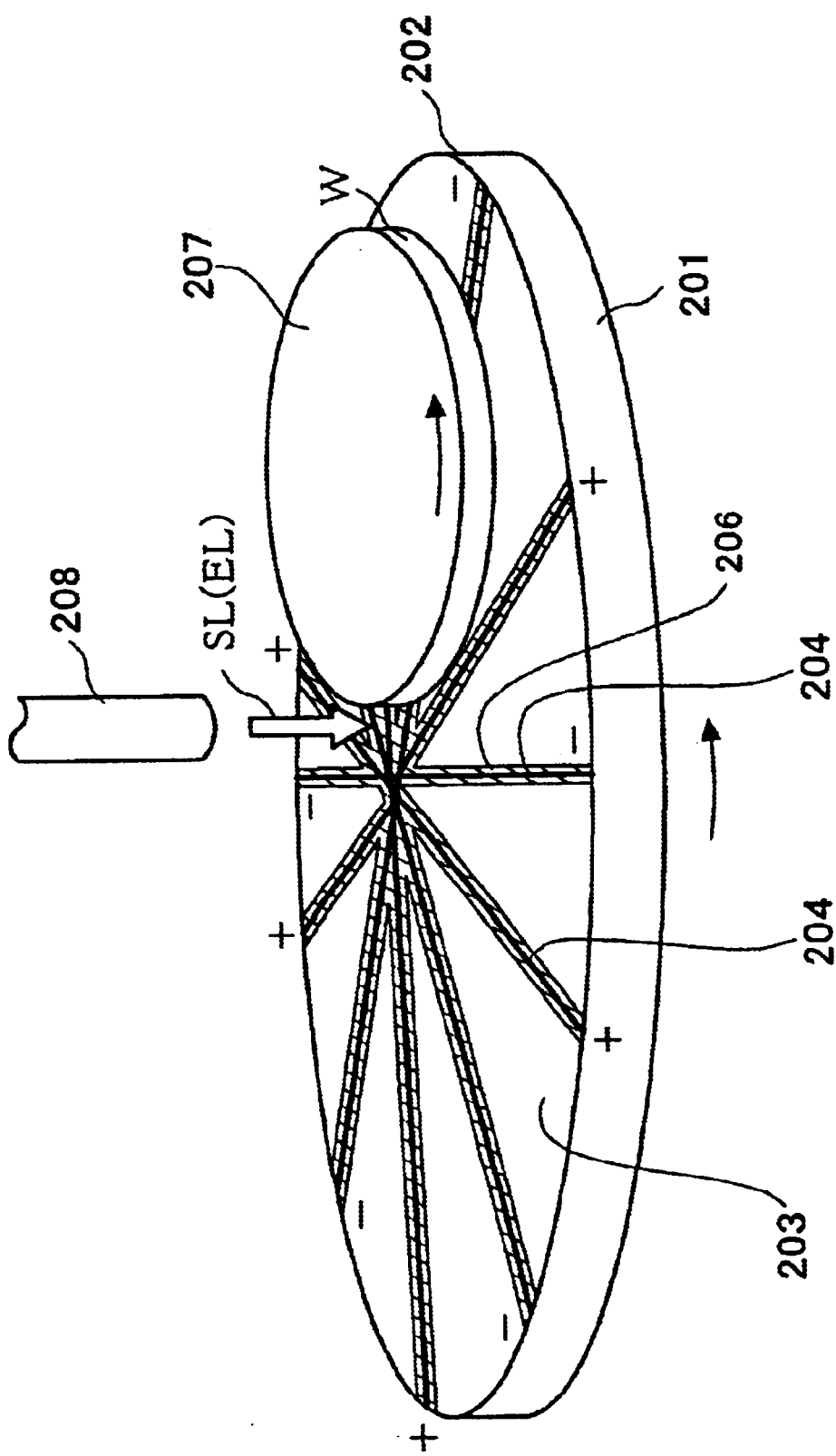
FIG. 28 is a schematic view of the configuration of a polishing apparatus according to another embodiment of the present invention.

FIG. 28 is a schematic view of the configuration of a polishing apparatus according to another embodiment of the present invention.

The polishing apparatus shown in FIG. 28 is obtained by adding the electrolytic polishing function of the present invention to the CMP apparatus of the related art. It flattens the surface of the wafer W by bringing the entire surface of the wafer W chucked by a wafer chuck 207 into contact with the polishing surface of the polishing tool comprised of a plate 201 to which a polishing pad (polishing fabric) 202 is adhered while rotating the wafer W.

Anode electrodes 204 and cathode electrodes 203 are alternately radially arranged on the polishing pad 202. Further, the anode electrodes 204 and the cathode electrodes 203 are electrically insulated by an insulator 206, and the anode electrodes 204 and the cathode electrodes 203 are supplied with the current from the plate 201 side. The polishing pad 202 is constituted by these anode electrodes 204, cathode electrodes 203, and insulator 206.

Further, the wafer chuck 207 is formed by the insulation material.

Further, this polishing apparatus is provided with a feeder 208 for feeding the electrolyte EL and the slurry SL to the surface of the polishing pad 202, whereby electrolytic composite polishing combining electrolytic polishing and chemical mechanical polishing becomes possible.

Figure 29:
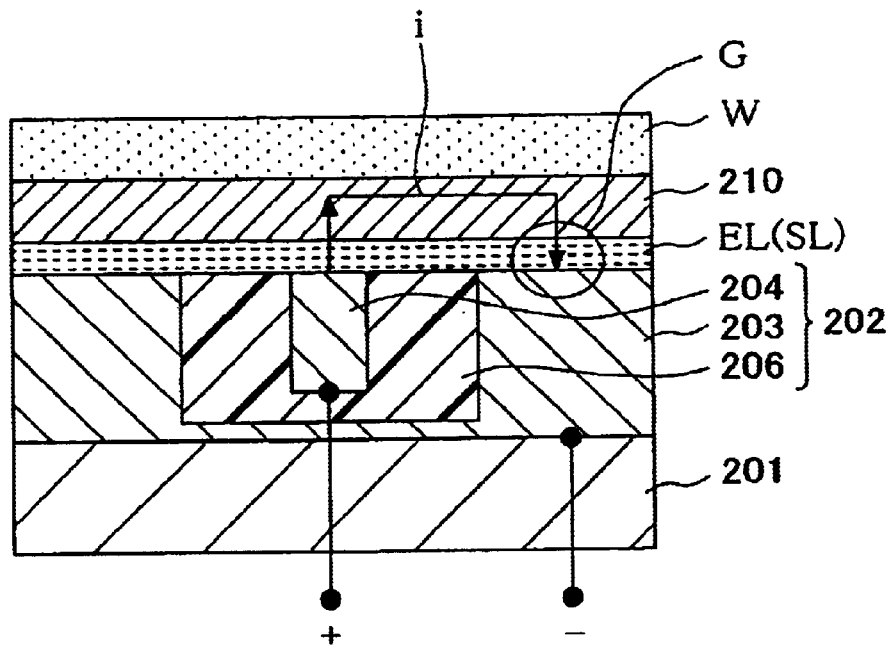
FIG. 29 is a view for explaining an electrolytic composite polishing operation by the polishing apparatus shown in FIG. 28.

Here, FIG. 29 is a view for explaining the electrolytic composite polishing operation by the polishing apparatus having the above configuration. Note that, it is assumed that for example a copper film 210 is formed on the surface of the wafer W.

As shown in FIG. 29, DC voltage is applied between the anode electrodes 204 and the cathode electrodes 203 in the state where the electrolyte EL and the slurry SL are interposed between the copper film 210 formed on the surface of the wafer W and the polishing surface of the polishing pad 202, during the electrolytic composite polishing. The current i passes through the electrolyte EL from the anode electrode 204, is transmitted in the copper film 210, and passes through the electrolyte EL again to flow to the cathode electrode 203.

At this time, near the interior of the circle G shown in FIG. 29, the copper film 210 is eluted by the electrolytic action. The copper film 210 is further removed by the mechanical removal action by the polishing pad 202 and the slurry SL.

By employing such a configuration, effects similar to those by the polishing apparatus 1 according to the embodiments are exhibited.

Figure 30:
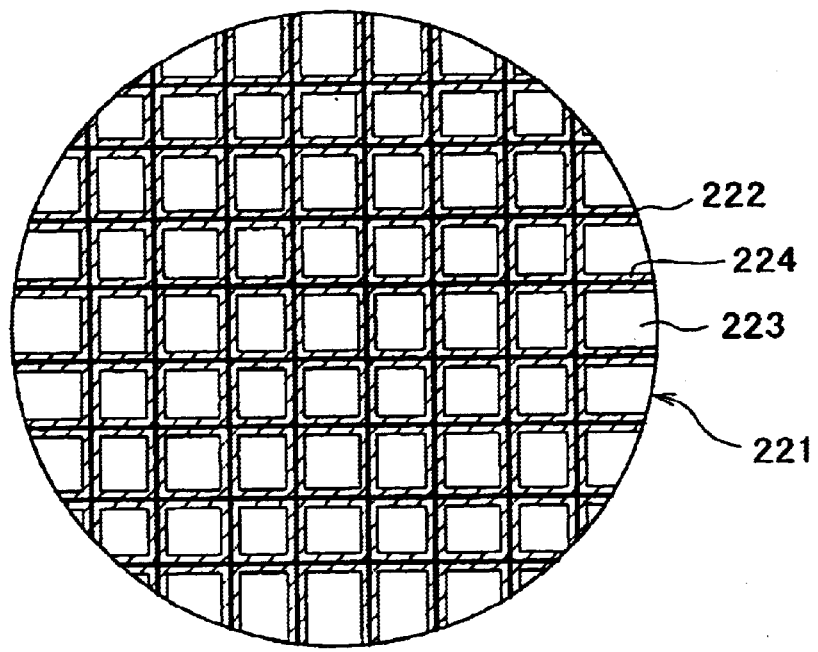
FIG. 30 is a view of another example of an electrode configuration of a polishing pad.

Note that the arrangement of the anode electrodes and the cathode electrodes provided on the polishing pad is not limited to the configuration of FIG. 28. For example, as shown in FIG. 30, it is also possible to employ a polishing pad 221 in which a plurality of linear anode electrodes 222 are vertically and laterally aligned at equal intervals, a cathode electrode 223 is arranged in each rectangular region surrounded by the anode electrodes 222, and the anode electrodes 222 and the cathode electrodes 223 are electrically insulated by an insulator 224.

Figure 31:
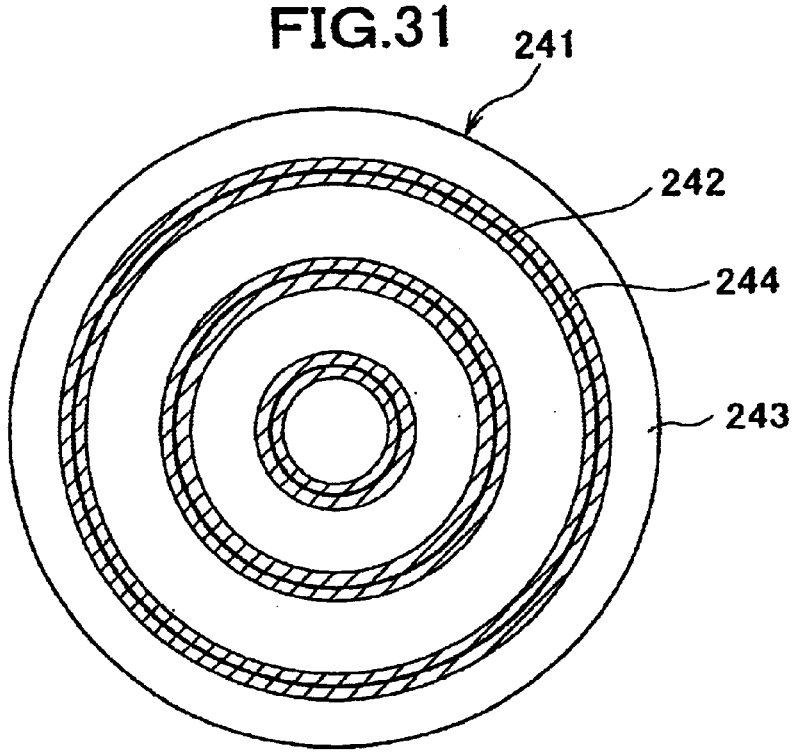
FIG. 31 is a view of still another example of an electrode configuration of a polishing pad.
Figure 32:
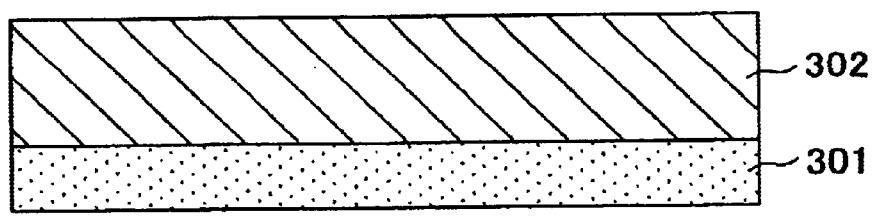
FIG. 32 is a sectional view of an interconnection forming process by a dual damascene process.
Figure 33:
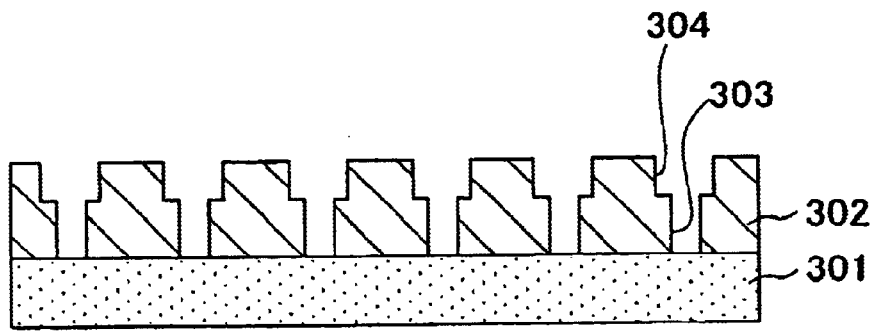
FIG. 33 is a sectional view of an interconnection forming process continued from FIG. 32.
Figure 34:
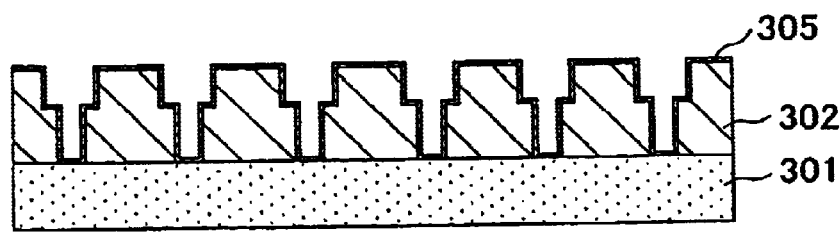
FIG. 34 is a sectional view of an interconnection forming process continued from FIG. 33.
Figure 35:
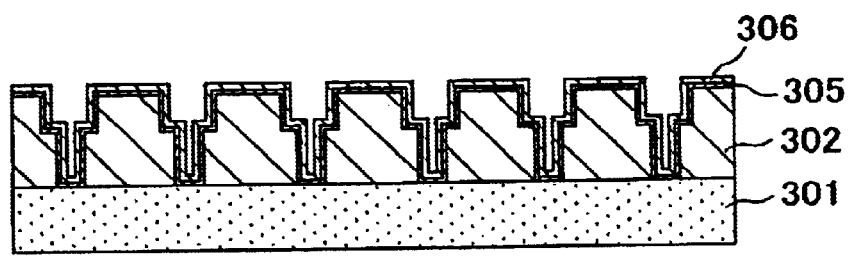
FIG. 35 is a sectional view of an interconnection forming process continued from FIG. 34.
Figure 36:
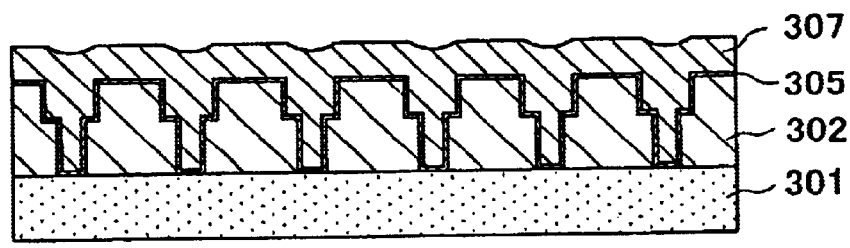
FIG. 36 is a sectional view of an interconnection forming process continued from FIG. 35.
Figure 37:
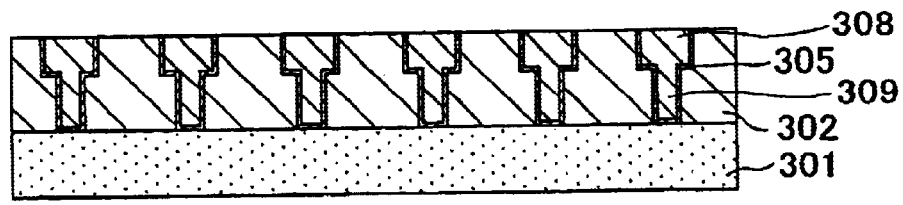
FIG. 37 is a sectional view of an interconnection forming process continued from FIG. 36.
Figure 38:
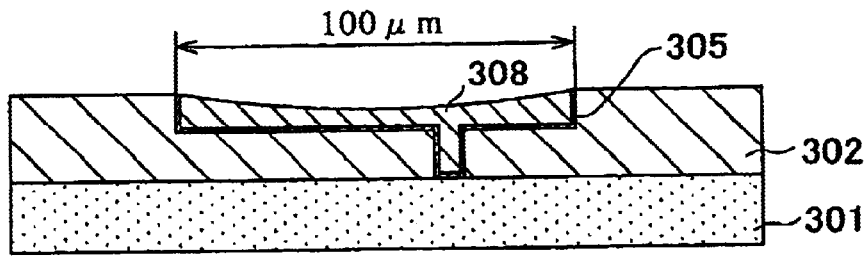
FIG. 38 is a sectional view for explaining dishing occurring in polishing of a metal film by the CMP process.
Figure 39:
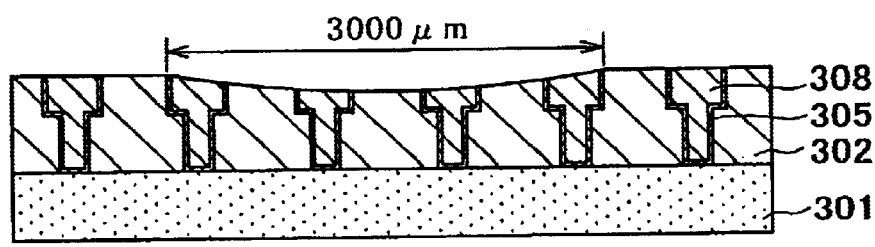
FIG. 39 is a sectional view for explaining erosion occurring in polishing of a metal film by the CMP process.
Figure 40:
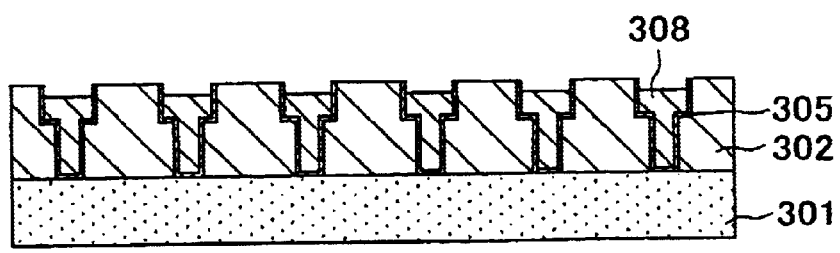
FIG. 40 is a sectional view for explaining a recess occurring in polishing of a metal film by the CMP process.
Figure 41:
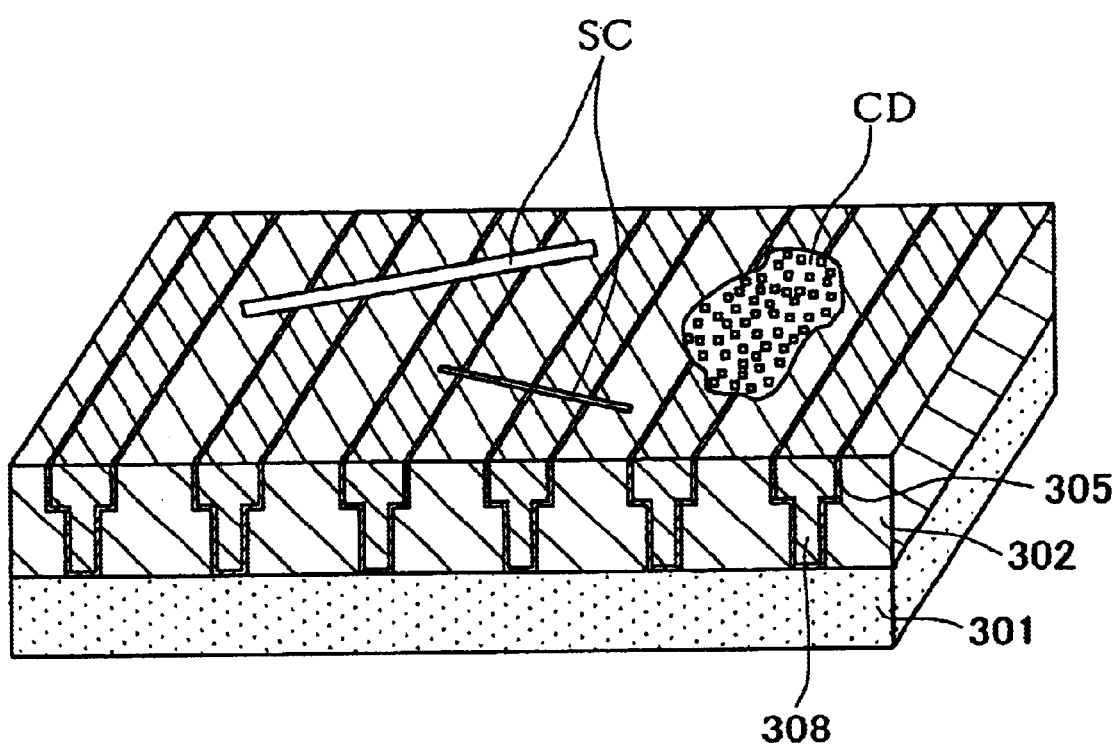
FIG. 41 is a sectional view for explaining a scratch SC and chemical damage CD occurring in polishing of a metal film by the CMP process.

Further, for example, as shown in FIG. 31, it is also possible to employ a polishing pad 241 in which annular anode electrodes 242 having radii different from each other are arranged in concentric circles, cathode electrodes 243 are arranged in the annular regions formed between the anode electrodes 242, and the anode electrodes 242 and the cathode electrodes 243 are electrically insulated by an insulator 244.

Summarizing the effects of the present invention, according to the present invention, since the metal film is polished by the composite actions of mechanical polishing and electrolytic polishing, in comparison with the case of the flattening of the metal film by mechanical polishing, a very highly efficient selective removal and flattening of the projecting portions of the metal film become possible.

Further, according to the present invention, since current is supplied using the polishing tool as the cathode, the phenomenon where the positively charged particles and polishing abrasive in the polishing agent are attracted by the polishing tool and remain on the wafer surface can be prevented, thus the yield can be improved.

Further, according to the present invention, since highly efficient removal of the metal film becomes possible, a sufficient polishing rate is obtained even with a relatively low polishing pressure and the occurrence of scratches, dishing, or erosion in the polished metal film can be suppressed.

Further, according to the present invention, since a sufficient polishing rate is obtained even with a relatively low polishing pressure, even in the case where an organic low dielectric constant film or porous low dielectric constant insulation film having a relatively low mechanical strength is used as the inter-layer insulation film in order to reduce the dielectric constant from the viewpoint of lowering the power consumption and increasing the speed of the semiconductor device, the invention can be easily applied.

Further, according to the present invention, since the barrier film remaining on the inter-layer insulation film or the metal portion is efficiently removed due to the electrolytic action and the elution from the exposed portion of the insulation film stops, the precision of stopping of the polishing can be automatically secured, and the dishing and erosion can be suppressed.

Further, according to the present invention, since the electrolytic current can be monitored and the polishing process managed, it becomes possible to correctly grasp the state of progress of the polishing process.

Further, according to the present invention, since the electric resistance value between the polishing tool and the electrode member is monitored, even in the case where film through which almost no current flows or current does not flow and the metal film are simultaneously polished, the polishing process can be correctly managed.

While the invention has been described with reference to specific embodiment chosen for purpose of illustration, it should be apparent that numerous modifications could be made thereto by those skilled in the art without departing from the basic concept and scope of the invention.

What is claimed is:

1. A method for producing a semiconductor device, including the steps of:

forming an interconnection groove for forming an interconnection in an insulation film formed on a substrate, stacking a metal film on said insulation film so as to bury said interconnection groove, forming a passivation film exhibiting a function of preventing an electrolytic reaction of the metal film at the surface of the metal film stacked on said insulation film, selectively removing the passivation film on a projecting portion existing at the surface of said metal film generated by the burying of said interconnection groove in the passivation film formed on said metal film by mechanical polishing and thereby exposing the projecting portion of the related metal at the surface, and removing the projecting portion of said exposed metal film by electrolytic polishing and flattening the unevenness of the surface of said metal film generated due to the burying of said interconnection groove.

2. A method for producing a semiconductor device as set forth in claim 1, further including a step of removing excess metal film present on the insulation film from the metal film with the flattened surface by electrolytic composite polishing combining electrolytic polishing and mechanical polishing so as to form an interconnection.

3. A method for producing a semiconductor device as set forth in claim 2, wherein said electrolytic composite polishing combines electrolytic polishing and chemical mechanical polishing.

4. A method for producing a semiconductor device as set forth in claim 2, further including the steps of:

forming a barrier film comprised of a conductive material for preventing diffusion of said metal film to said insulation films so as to cover said insulation film and the inside of said groove after forming the interconnection groove and removing the excess metal film present on the insulation film by electrolytic composite polishing until the barrier film is exposed at its surface after a projecting portion of the exposed metal film is flattened, and removing the excess barrier film present on the insulation film by electrolytic composite polishing until the insulation film is exposed at its surface.

5. A method for producing a semiconductor device as set forth in claim 4, further including the steps of:

interposing an electrolyte between the polishing surface of the polishing tool having conductivity and the passivation film and supplying a voltage between the metal film and barrier film and the polishing tool using the metal film and barrier film as an anode and the polishing tool as a cathode;

making the polishing tool move relative to the surface of the passivation film to selectively remove the passivation film formed on a projecting portion of the metal film; and making the projecting portion of the metal film exposed from the selectively removed passivation film elute by the electrolytic action of the electrolyte.

6. A method for producing a semiconductor device as set forth in claim 5, further including the steps of:

bringing the electrode member supplied with voltage with the polishing tool into contact or proximity with said metal film and barrier film to pass a current to said metal film and barrier film, and monitoring the current flowing to said polishing tool from said electrode member through said metal film and barrier film and managing the progress of polishing of said metal film and barrier film based on the magnitude of the value of said current.

7. A method for producing a semiconductor device as set forth in claim 5, further including the steps of:

bringing the electrode member supplied with voltage with the polishing tool into contact or proximity with said metal film and barrier film to pass a current to said metal film and barrier film, and monitoring the magnitude of the electrical resistance occurring between said electrode member and said polishing tool and managing the progress of polishing of said metal film and barrier film based on the value of the electrical resistance.

8. A method for producing a semiconductor device as set forth in claim 5, further including a step of interposing a chemical polishing agent including a polishing abrasive between the polishing surface of said polishing tool and said passivation film and selectively removing said passivation film.

9. A method for producing a semiconductor device as set forth in claim 5, further including a step of removing said excess metal film and barrier film by using different chemical polishing agents with high polishing rates with respect to the materials comprising the metal film and barrier film.

10. A method for producing a semiconductor device as set forth in claim 5, wherein the step of removing the excess barrier film includes a step of reducing the voltage supplied between the barrier film and polishing tool from the voltage supplied between the metal film and polishing tool in the step of removing the excess metal film.

11. A method for producing a semiconductor device as set forth in claim 2, wherein:

the step of forming the interconnection groove includes the step of forming a contact hole for connecting an impurity diffusion layer or interconnection formed at a layer below the insulation film with an interconnection formed on said insulation film together with forming an interconnection use groove, and the step of burying the interconnection groove with metal includes a step of burying the contact hole together with the interconnection groove with metal.

12. A method for producing a semiconductor device as set forth in claim 11, wherein copper is used for the material forming the interconnection, and the interconnection groove and contact hole are buried with copper using an electroplating process.

13. A method for producing a semiconductor device as set forth in claim 4, wherein any of Ta, Ti, TaN, and TiN is used for the material forming the barrier film.

14. A method for producing a semiconductor device as set forth in claim 1, wherein the passivation film comprises an oxide film obtained by oxidizing the surface of the metal film.

15. A method for producing a semiconductor device as set forth in claim 14, wherein said oxide film is formed by supplying an oxidizing agent to the surface of said metal film.

16. A method for producing a semiconductor device as set forth in claim 1, wherein said passivation film forms on the surface of the metal film a film comprised of a material exhibiting an action of preventing an electrolytic reaction of a metal comprising the metal film.

17. A method for producing a semiconductor device as set forth in claim 16, wherein said passivation film forms on the surface of the metal film one of a water-repelling film, oil film, antioxidant film, a film comprised of a surfactant, a film comprised of a chelating agent, and a film comprised of a silane coupling agent.

18. A method for producing a semiconductor device as set forth in claim 1, wherein said passivation film has a higher electrical resistance and a lower mechanical strength than said metal film.

* * * * *